(12) United States Patent
Nygren et al.

(10) Patent No.: US 8,671,304 B2
(45) Date of Patent: Mar. 11, 2014

(54) ADJUSTMENT OF WRITE TIMING BASED ON A TRAINING SIGNAL

(75) Inventors: Aaron John Nygren, San Francisco, CA (US); Ming-Ju Edward Lee, San Jose, CA (US); Shadi M. Barakat, San Mateo, CA (US); Xiaoling Xu, Cupertino, CA (US); Toan Duc Pham, San Jose, CA (US); Warren Fritz Kruger, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 889 days.

(21) Appl. No.: 12/846,965

(22) Filed: Jul. 30, 2010

(65) Prior Publication Data
US 2011/0185218 A1    Jul. 28, 2011

Related U.S. Application Data

(60) Provisional application No. 61/240,700, filed on Sep. 9, 2009.

(51) Int. Cl.
*G06F 1/04* (2006.01)

(52) U.S. Cl.
USPC .......................................... 713/503; 365/194

(58) Field of Classification Search
USPC ............ 713/503; 710/305, 104; 365/190–194
See application file for complete search history.

(56) References Cited

U.S. PATENT DOCUMENTS

2013/0064023 A1* 3/2013 Ware ........................ 365/189.14

* cited by examiner

*Primary Examiner* — Clifford Knoll
(74) *Attorney, Agent, or Firm* — Sterne, Kessler, Goldstein & Fox P.L.L.C.

(57) ABSTRACT

A method, system, and computer program product are provided for adjusting write timing in a memory device based on a training signal. For instance, the method can include configuring the memory device in a training mode of operation. The method can also include determining a write timing window between a signal on a data bus and a write clock signal based on the training signal. Further, the method includes adjusting a phase difference between the signal on the data bus and the write clock signal based on the write timing window. The memory device can recover data on the data bus based on the adjusted phase difference.

39 Claims, 18 Drawing Sheets ial Application No. 61/240,700, filed Sep. 9, 2009, titled
ADJUSTMENT OF WRITE TIMING BASED ON A TRAINING SIGNAL

CROSS REFERENCE TO RELATED APPLICATION

This application claims the benefit of U.S. Provisional Application No. 61/240,700, filed Sep. 9, 2009, titled "Adjustment of Write Timing Based on Training Signal," which is incorporated herein by reference in its entirety.

BACKGROUND

1. Field

Embodiments of the present invention generally relate to an adjustment of write timing in a memory device. More specifically, embodiments of the present invention refer to adjusting the write timing of the memory device based on a training signal.

2. Background

Data communication between a processing unit and a memory device typically involves sending data along signal paths such as, for example, wires and traces. In a memory device with a synchronous interface, the processing unit may transmit a clock signal along with the data signal to the memory device. The clock signal is used to determine when the data signal should be latched by the memory device, thus synchronizing the memory device to the processing unit. For proper data recovery, the memory device must receive the clock signal within a time period that allows the clock signal to sample the data signal (e.g., the clock signal must sample the data signal within a period of time corresponding to a data eye of the data signal). Otherwise, the memory device may not recover the correct data value.

Real-world variations, such as temperature and jitter, can cause attenuation in the transmitted data signal and clock signal from the processing unit to the memory device, thus causing a loss in data signal integrity. This can result in poor or inaccurate data recovery by the memory device. As operating frequencies in computer systems increase, a need arises to transmit data more rapidly from the processing unit to the memory device. Accordingly, the memory device not only needs to sample data at a faster rate, but also needs to sample the data at the proper time.

SUMMARY OF EMBODIMENTS

Embodiments of the present invention include a method for adjusting write timing in a memory device. The method can include configuring the memory device in a training mode of operation. The method can also include determining a write timing window between a signal on a data bus and a write clock signal based on a training signal. Further, the method can include adjusting a phase difference between the signal on the data bus and the write clock signal based on the write timing window, where the memory device recovers the signal on the data bus based on the adjusted phase difference.

Embodiments of the present invention also include another method for adjusting write timing in a memory device. The method can include the following: operating in a training mode of operation; receiving a training signal, where the training signal can include a first data pattern transmitted from a processing unit; storing the training signal, where the stored training signal can include a second data pattern; transmitting the second data pattern to the processing unit; and, receiving a signal on a data bus, where a phase difference between the signal on the data bus and a write clock signal is within a write timing window, the write timing window based on a comparison between the first data pattern and the second data pattern.

Embodiments of the present invention include a system to adjust write timing in a memory device. The system can include a memory device and a processing unit coupled to the memory device. The processing unit can be configured to perform the following functions: determine a write timing window between a signal on a data bus and a write clock signal based on a training signal during a training mode of operation; and, adjust a phase difference between the signal on the data bus and the write clock signal based on the write timing window, where the memory device recovers the signal on the data bus based on the adjusted phase difference.

Embodiments of the present invention also include another system to adjust write timing in a memory device. The system can include a processing unit and a memory device coupled to the processing unit. The memory device can be configured to perform the following functions: receive a training signal during a training mode of operation, where the training signal comprises a first data pattern transmitted from a processing unit; store the training signal, where the stored training signal comprises a second data pattern; transmit the second data pattern to the processing unit; and, receive a signal on a data bus, where a phase difference between the signal on the data bus and a write clock signal is within a write timing window, the write timing window based on a comparison between the first data pattern and the second data pattern.

Embodiments of the present invention further include a computer program product to adjust write timing in a memory device. The computer program product includes a computer-usable medium having computer program logic recorded thereon enabling a processor to analyze software code. The computer program logic includes the following: first computer readable program code that enables a processor to configure the memory device in a training mode of operation; second computer readable program code that enables a processor to determine a write timing window between a signal on a data bus and a write clock signal based on a training signal; and, third computer readable program code that enables a processor to adjust a phase difference between the signal on the data bus and the write clock signal based on the write timing window, where the memory device recovers the signal on the data bus based on the adjusted phase difference.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

BRIEF DESCRIPTION OF THE DRAWINGS

The accompanying drawings, which are incorporated herein and form a part of the specification, illustrate embodiments of the present invention and, together with the description, further serve to explain the principles of the invention and to enable a person skilled in the relevant art to make and use the invention.

DETAILED DESCRIPTION

The following detailed description refers to the accompanying drawings that illustrate exemplary embodiments consistent with this invention. Other embodiments are possible, and modifications can be made to the embodiments within the spirit and scope of the invention. Therefore, the detailed description is not meant to limit the invention. Rather, the scope of the invention is defined by the appended claims.

It would be apparent to one of skill in the relevant art that the present invention, as described below, can be implemented in many different embodiments of software, hardware, firmware, and/or the entities illustrated in the figures. Thus, the operational behavior of embodiments of the present invention will be described with the understanding that modifications and variations of the embodiments are possible, given the level of detail presented herein.

Figure 1:
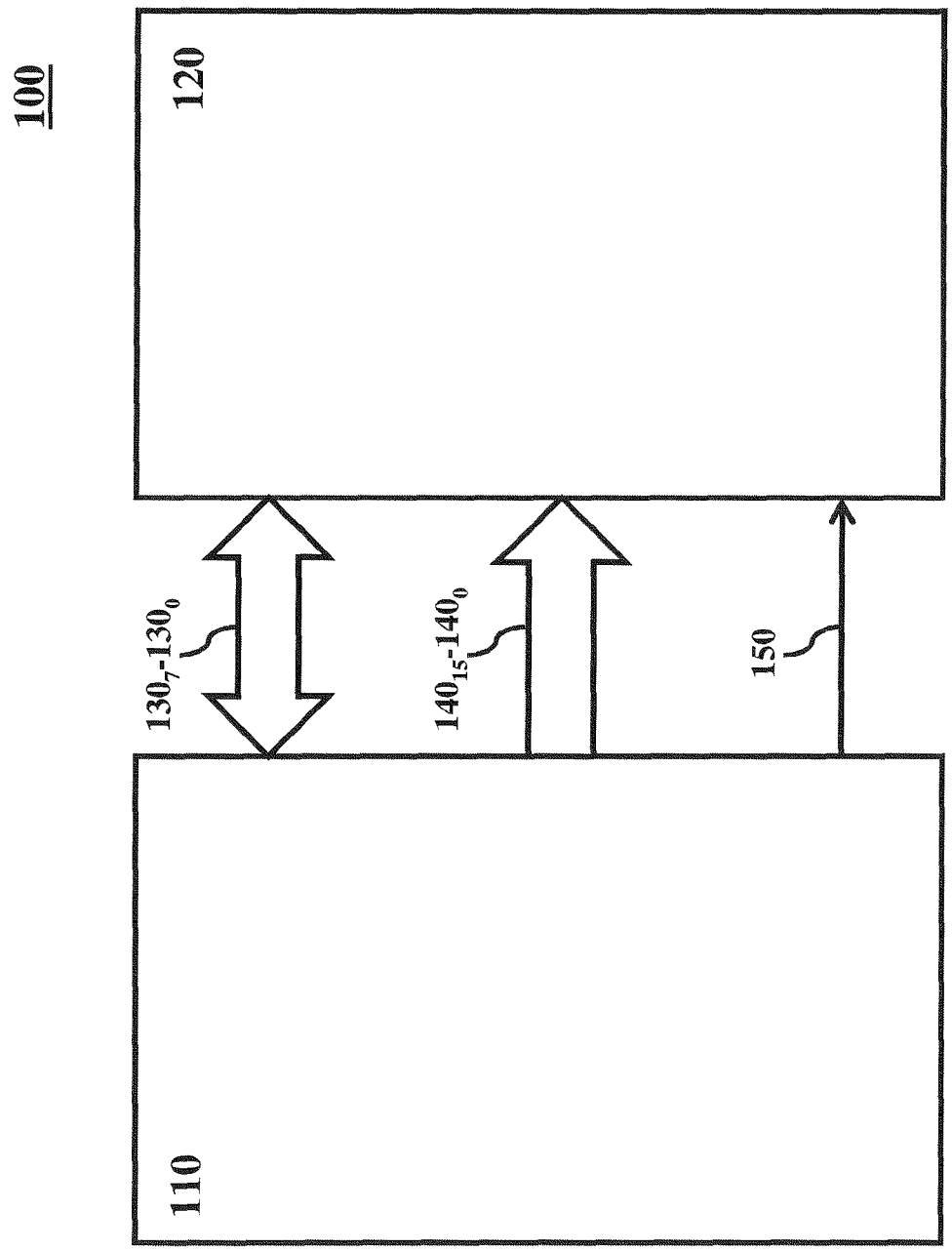
FIG. 1 is an illustration of an example computer system with a processing unit and a memory device.

FIG. 1 is an illustration of an example computer system 100 with a processing unit and a memory device. Computer system 100 includes a processing unit 110, a memory device 120, a data bus $130_7$-$130_0$, an address/control (A/C) bus $140_{15}$-$140_0$, and a clock signal 150 (e.g., a write clock signal).

Processing unit 110 transmits address/control signals, via A/C bus $140_{15}$-$140_0$, to memory device 120. Address/control signals can include, for example, clock enable (/CKE), chip select (/CS), row address strobe (/RAS), column address strobe (/CAS), write enable (/WE), and an address bus (e.g., A[8:0]). A command decoder (not shown) in memory device 120 receives the address/control signals and, based on bit settings of the address/control signals, indicates a mode of operation for memory device 120. Modes of operation for memory device 120 can include, for example, a read operation, a write operation, an idle operation, and a refresh operation.

In a synchronous memory system, the address/control signals on A/C bus $140_{15}$-$140_0$ of FIG. 1 are timed relative to an edge of clock signal 150 (e.g., a rising edge of clock signal 150), in which the address/control signals are sampled on the edge of clock signal 150. For example purposes, A/C bus $140_{15}$-$140_0$ is illustrated as a 16-bit data bus. Based on the description herein, a person skilled in the relevant art will recognize that the bus width of A/C bus $140_{15}$-$140_0$ can vary (e.g., 8-bits, 32-bits, etc.). Address/control buses and associated signals traveling on these buses are known to those persons skilled in the relevant art.

Processing unit 110 transmits and receives data, via data bus $130_7$-$130_0$, to and from memory device 120. During a write operation, data is transferred from processing unit 110 to memory device 120 via data bus $130_7$-$130_0$. During a read operation, data is transferred from memory device 120 to processing unit 110 via data bus $130_7$-$130_0$. In a synchronous memory system, the rate at which the data is transmitted and received by processing unit 110 is based on a clock signal such as, for example, clock signal 150. For example purposes, data bus $130_7$-$130_0$ is illustrated as an 8-bit bi-directional data bus. Based on the description herein, a person skilled in the relevant art will recognize that the bus width of data bus $130_7$-$130_0$ can vary (e.g., 16-bits, 32-bits, etc.). Data buses and associated signals traveling on these buses are known to those persons skilled in the relevant art.

Memory device 120 stores data transmitted from processing unit 110. The receipt and storage of data (transmitted from processing unit 110) is known as "writing" to memory device 120. Conversely, data can be retrieved from memory device 120, which is known as "reading" from memory device 120. Memory device 120 can be configured with a synchronous interface, in which memory device 120 waits for clock signal 150 before processing the data on data bus $130_7$-$130_0$. For instance, memory device 120 can generate an internal clock signal, aligned with clock signal 150, to receive the data from data bus $130_7$-$130_0$ or to transmit the data from memory device 120 to processing unit 110 via data bus $130_7$-$130_0$. The internal clock signal of memory device 120 can be, for example, a multiple of the frequency of clock signal 150 (e.g., 2×, 4×, etc.) as understood by a person of ordinary skill in the relevant art.

Figure 2:
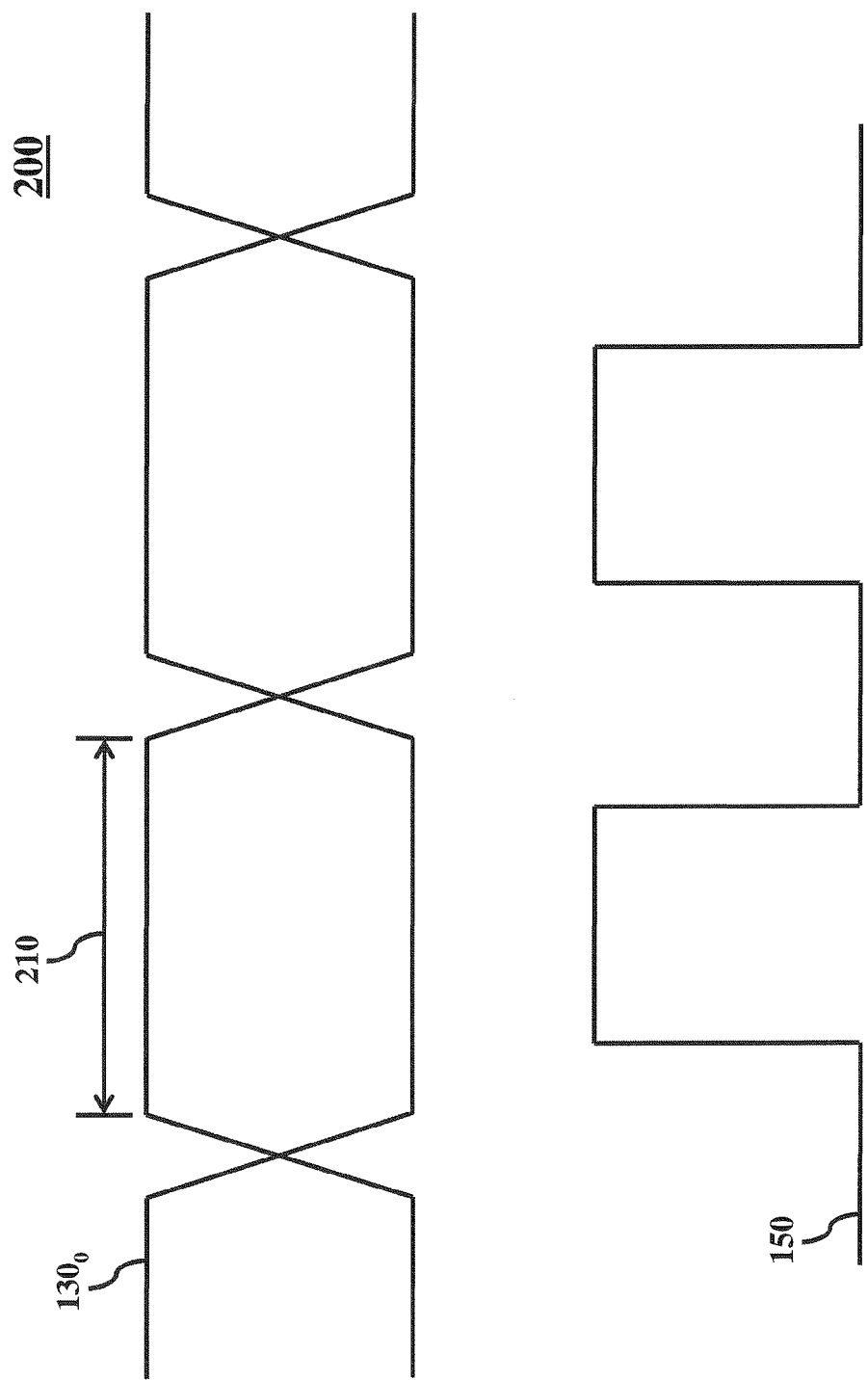
FIG. 2 is an illustration of an exemplary write timing diagram that is representative of proper data recovery by a memory device.

FIG. 2 is an illustration of an exemplary write timing diagram 200 for computer system 100 that is representative of proper data recovery by memory device 120. Write timing diagram 200 includes timings for a data eye for data signal $130_0$ and clock signal 150, where the data eye can define a period of time 210 in which clock signal 150 can be used to sample data signal $130_0$ (e.g., proper data recovery by memory device 120 can occur within period of time 210). A data eye refers to, for example, a portion of data signal $130_0$ with a valid binary value. Here, clock signal 150 is center aligned to data signal $130_0$ and samples data signal $130_0$ within the data eye when clock signal 150 is HIGH (or has a logic value of '1'). As understood by a person of ordinary skill in the relevant art, the center alignment of clock signal 150 to data signal $130_0$ provides an ideal write timing for computer system 100 since memory device 120 is allowed a sufficient period of time to receive and sample data signal $130_0$. A person of ordinary skill in the art will understand that the alignment of clock signal 150 relative to data signal $130_0$ can occur in other alignment positions.

Figure 3:
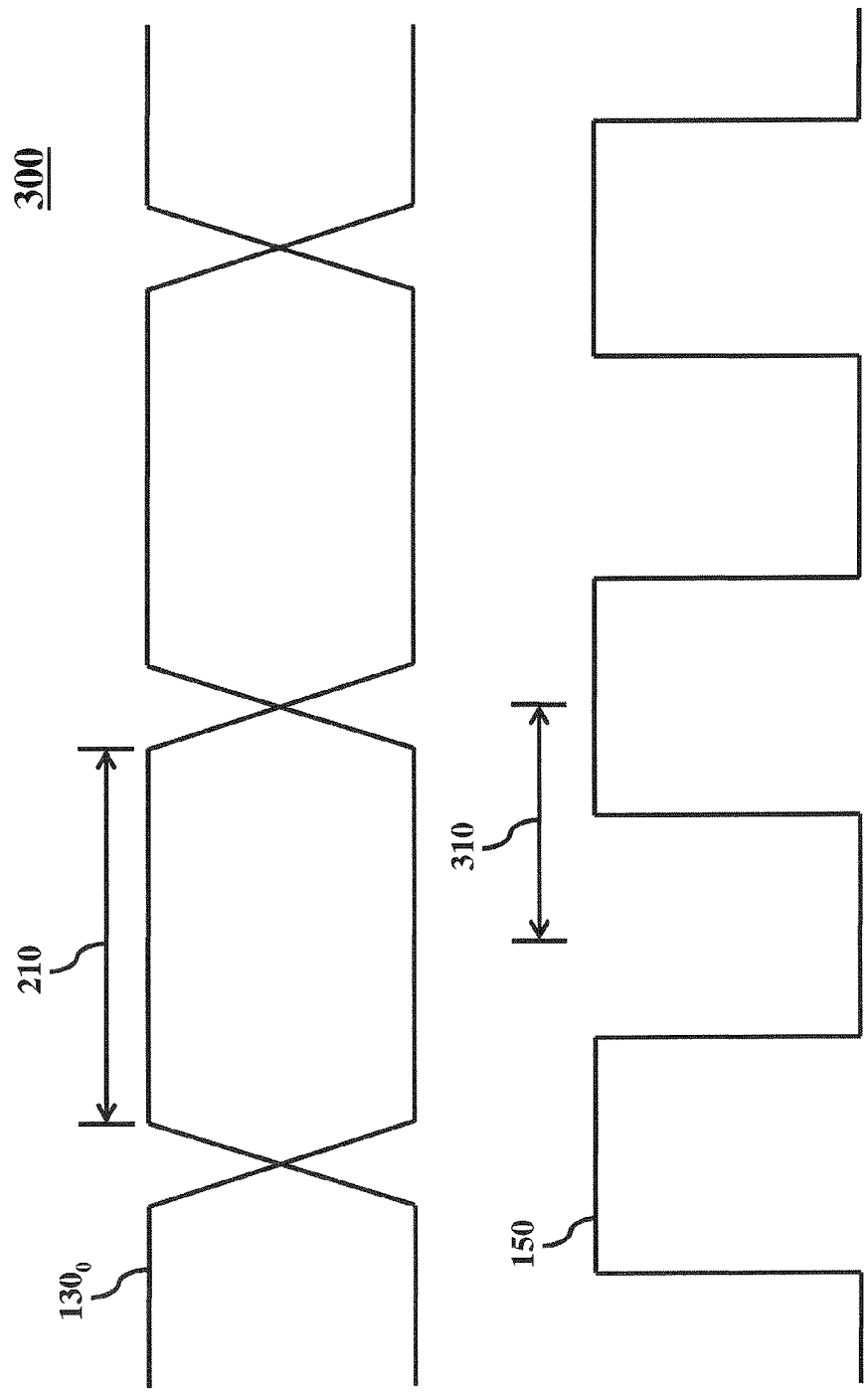
FIG. 3 is an illustration of an exemplary write timing diagram that is not representative of proper data recovery by a memory device.

FIG. 3 is an illustration of an exemplary write timing diagram 300 for computer system 100 that is not representative of proper data recovery by memory device 120. Similar to write timing diagram 200, write timing diagram 300 includes timings for the data eye of data signal $130_0$ and clock signal 150. However, clock signal 150 has a relative phase difference 310 (or timing skew) with respect to data signal $130_0$, where phase difference 310 may not provide memory device 120 a sufficient amount of time to sample data signal $130_0$ (e.g., a sufficient amount of time for memory device 120 to latch data signal $130_0$). Variations in relative phase difference 310 between data signal $130_0$ and clock signal 150 can be caused by various factors such as, for example, temperature and jitter in computer system 100. In exemplary write timing diagram 300, relative phase difference 310 can be defined by a difference between a center of data eye 210 and a center of clock signal 150 when clock signal 150 samples data signal $130_0$ (e.g., when clock signal 150 is HIGH or has a logic value of '1').

As the operating frequency of computer system 100 increases, memory device 120 not only needs to sample signals on data bus $130_7$-$130_0$ at a faster frequency, but also needs to sample the data signals at the proper time. Clock signal 150 should be optimally aligned with signals on data bus $130_7$-$130_0$ to ensure proper sampling of the data. To align clock signal 150 with signals on data bus $130_7$-$130_0$, memory device 120 can be placed in a training mode of operation so that the relative phase difference (or timing skew) between signals on data bus $130_7$-$130_0$ and clock signal 150 can be monitored and adjusted. As a result, computer system 100 can be configured such that the write timing between processing unit 110 and memory device 120 can be optimized.

Figure 4:
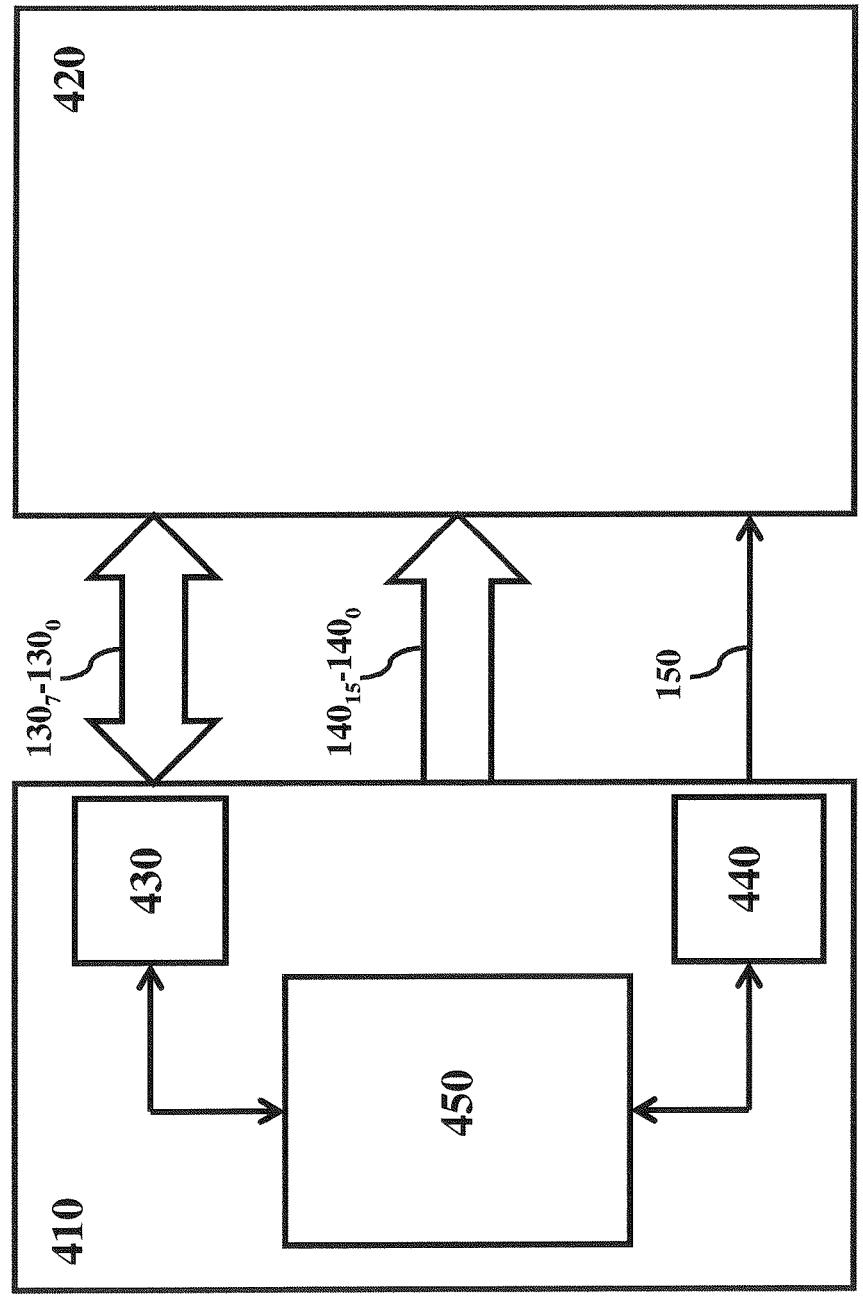
FIG. 4 is an illustration of an embodiment of a computer system to adjust write timing in a memory device.

FIG. 4 is an illustration of an embodiment of a computer system 400 to adjust write timing in a memory device. Computer system 400 includes a processing unit 410, a memory device 420, data bus $130_7$-$130_0$, A/C bus $140_{15}$-$140_0$, and clock signal 150 (also referred to herein as write clock signal 150). Data bus $130_7$-$130_0$, A/C bus $140_{15}$-$140_0$, and write clock signal 150 function in a similar manner as that described above with respect to FIG. 1.

In an embodiment, processing unit 410 and memory device 420 are integrated circuit (IC) devices on a circuit board with data bus $130_7$-$130_0$, A/C bus $140_{15}$-$140_0$, and write clock signal 150 communicatively coupling the two IC devices, where data bus $130_7$-$130_0$, A/C bus $140_{15}$-$140_0$, and write clock signal 150 can be wires, interconnects, or circuit board traces. In another embodiment, processing unit 410 and memory device 420 are integrated on a single IC device with data bus $130_7$-$130_0$, A/C bus $140_{15}$-$140_0$, and write clock signal 150 communicatively coupling processing unit 410 to memory device 420.

Data bus $130_7$-$130_0$, A/C bus $140_{15}$-$140_0$, and write clock signal 150 are connected to input/output (I/O) ports of processing unit 410 and memory device 420 that are used in the modes of operation of memory device 420 (e.g., read, write, idle, and refresh modes of operation). I/O ports that connect a processing unit to a memory device (e.g., DQ and clock pins) are known to persons skilled in the relevant art.

Processing unit 410 is a GPU according to an embodiment of the present invention. Alternatively, in another embodiment, processing unit 410 can be a CPU or a memory controller. Based on the description herein, a person skilled in the relevant art will recognize that embodiments of the present invention can be implemented with other types of processing units, which are within the scope and spirit of the present invention.

In an embodiment, processing unit 410 includes phase delay circuits 430 and 440 and controller 450. In an embodiment, phase delay circuit 430 is configured to delay a transmission of signals traveling on data bus $130_7$-$130_0$. Similarly, in an embodiment, phase delay circuit 440 is configured to delay write clock signal 150. Controller 450 is configured to control an amount of phase delay for each phase delay circuit 430 and 440 according to an embodiment of the present invention. The amount of phase delay issued by controller 450 to phase delay circuits 430 and 440 is described in detail below with respect to method 500 of FIG. 5. Phase delay circuits and associated controllers used to control the phase delay circuits are known to persons of ordinary skill in the relevant art.

In reference to FIG. 4, in an embodiment, memory device 420 is a dynamic random access memory (DRAM) device. Based on the description herein, a person skilled in the relevant art will recognize that embodiments of the present invention can be implemented with other types of memory devices. These other types of memory devices are within the scope and spirit of the present invention.

Figure 5:
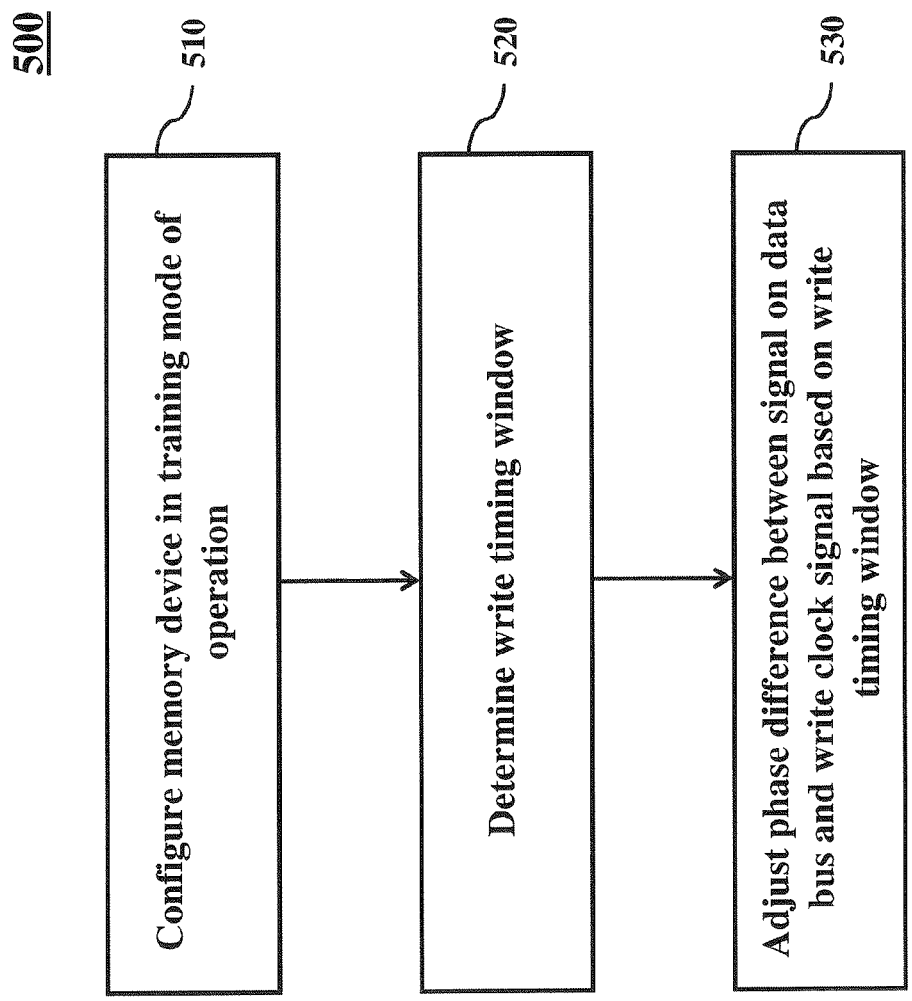
FIG. 5 is an illustration of an embodiment of a method for adjusting write timing in a memory device.

FIG. 5 is an illustration of an embodiment of a method 500 for adjusting write timing in a memory device. Method 500 can occur using, for example, computer system 400 of FIG. 4. For explanation purposes, computer system 400 will be used to facilitate in the description of method 500. However, based on the description herein, a person of ordinary skill in the relevant art will recognize that method 500 can be implemented in other computer systems.

In an embodiment, method 500 can be used by computer system 400 to adjust write timing between processing unit 410 and memory device 420. In particular, through one or more sequences of writing one or more data patterns to memory device 420 and reading the corresponding stored data patterns from memory device 420, controller 450 of processing unit 410 can adjust a phase difference between data signals on data bus $130_7$-$130_0$ and write clock signal 150 (via phase delay circuits 430 and 440) such that memory device 420 properly recovers data from data bus $130_7$-$130_0$.

In reference to method 500 of FIG. 5, in step 510, processing unit 410 issues one or more commands to configure memory device 420 in a training mode of operation. In an embodiment, the training mode of operation uses particular memory device resources (e.g., data bus $130_7$-$130_0$, A/C bus $140_{15}$-$140_0$, and write clock signal 150) to execute the steps of method 500.

As noted above, method 500 adjusts the write timing between processing unit 410 and memory device 420 through one or more sequences of write and read operations. In an embodiment, to perform the write and read operations of method 500, particular memory device resources are required such as, for example, data bus $130_7$-$130_0$, A/C bus $140_{15}$-$140_0$, and write clock signal 150. Accordingly, some modes of operation of memory device 420 cannot use these memory device resources during the training mode of operation, where these modes of operation can include, for example, read and write operations. Based on the description herein, a person of ordinary skill in the relevant art will recognize that other modes of operation of memory device 420 cannot be used during the training mode of operation.

However, certain modes of operation of memory device 420 do not utilize the memory device resources required by the training mode of operation. These certain modes of operation can include, for example, idle, refresh, and powerdown modes of operation. For the purposes of method 500, the training mode of operation can be executed by memory device 420 during these certain modes of operation since method 500 can be executed during these operations (e.g., idle, refresh, and powerdown modes of operation). A person of ordinary skill in the relevant art will recognize that other modes of operation for memory device 420 can be used during the training mode of operation based on the description herein.

In step 520, processing unit 410 determines a write timing window between data signals on data bus $130_7$-$130_0$ and write clock signal 150 based on a training signal. The write timing window refers to a time period in which data signals on data bus $130_7$-$130_0$, write clock signal 150, or both the data signals on data bus $130_7$-$130_0$ and write clock signal 150 can be phase-adjusted in relation to one another such that memory device 420 properly recovers the data signals on data bus $130_7$-$130_0$. In an embodiment, the write timing window is defined by a first timing boundary and a second timing boundary. The write timing window and its associated first and second write timing boundaries are described in further detail below with respect to FIGS. 6-17.

In an embodiment, the training signal is a first data pattern that is, for example, an 8-bit data pattern with a random combination of logic values of 1's and 0's. The first data pattern (i.e., training signal) is transmitted from processing unit 410 to memory device 420, where memory device 420 is configured to store the first data pattern based on the write clock signal. In particular, memory device 420 samples the information in the first data pattern at an interface of memory device 420 (e.g., an I/O pin interface of memory device 420) based on write clock signal 150 according to an embodiment of the present invention. Based on the description herein, a person of ordinary skill in the relevant art will recognize that the bit length of the first data pattern can vary (e.g., 4-bits, 6-bits, etc.).

After the first data pattern is received and stored in memory device 420, processing unit 410 reads a second data pattern from memory device 420. The second data pattern represents the first data pattern received at the interface of memory device 420 and stored in memory device 420. In an embodiment, the second data pattern can contain different bit information from the bit information of the first data pattern transmitted from processing unit 410 since a timing skew may have occurred between write clock signal 150 and the data signals on data bus $130_7$-$130_0$. This timing skew is similar to the timing skew described above with respect to FIG. 3.

Processing unit 410 compares the first data pattern to the second data pattern to determine whether the two data patterns match each other. In an embodiment, controller 450 of processing unit 410 compares the first data pattern to the second data pattern, where controller 450 stores the bit information of the first data pattern transmitted to memory device 420. Controller 450 compares the bit information from the first data pattern to bit information from the second data pattern, where the two data patterns are compared to each other on a bit-by-bit basis, according to an embodiment of the present invention. In other words, each bit in the first data pattern is compared to a corresponding bit in the second data pattern to determine whether the first and second data patterns match each other.

In an embodiment, controller 450 determines a first timing boundary and a second timing boundary of the write timing window based on the comparison of the first and second data patterns. The following description of the determination of the first and second timing boundaries of the write timing window is described in the context of two scenarios: (1) a scenario when the first and second data patterns match each other as described in FIGS. 6-11; and, (2) a scenario when the first and second data patterns do not match each other as described in FIGS. 12-17. For ease of explanation, the following description of the first and second timing boundaries of the write timing window is based on data signal $130_0$ of data bus $130_7$-$130_0$. A person of ordinary skill in the relevant art will recognize that, based on the description herein, the flowcharts and exemplary timing diagrams described below are equally applicable to data signals on data bus $130_7$-$130_0$.

Figure 6:
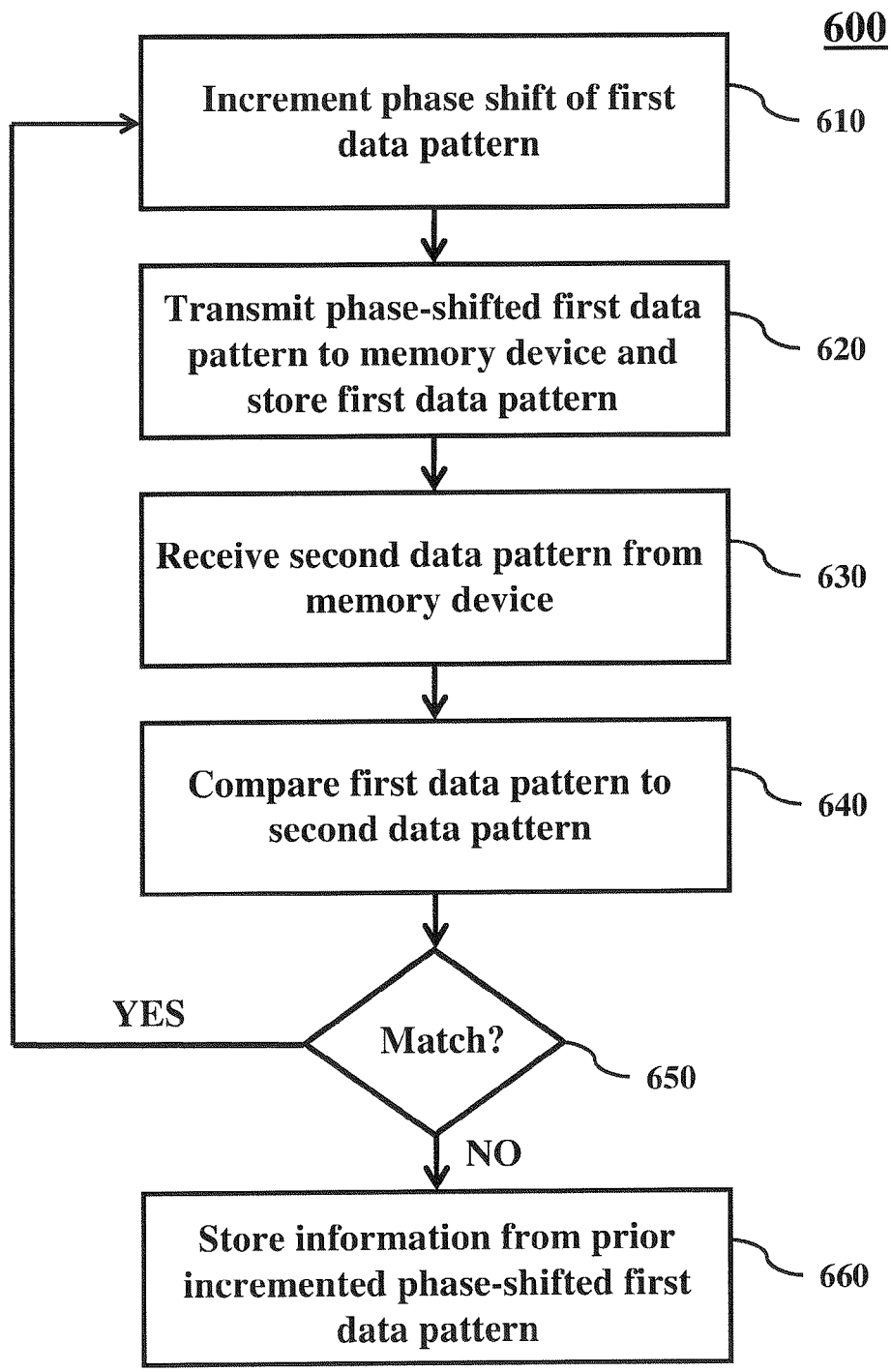
FIG. 6 is an illustration of an embodiment of a flowchart to determine a first write timing boundary of a write timing period when first and second data patterns match each other.
Figure 7:
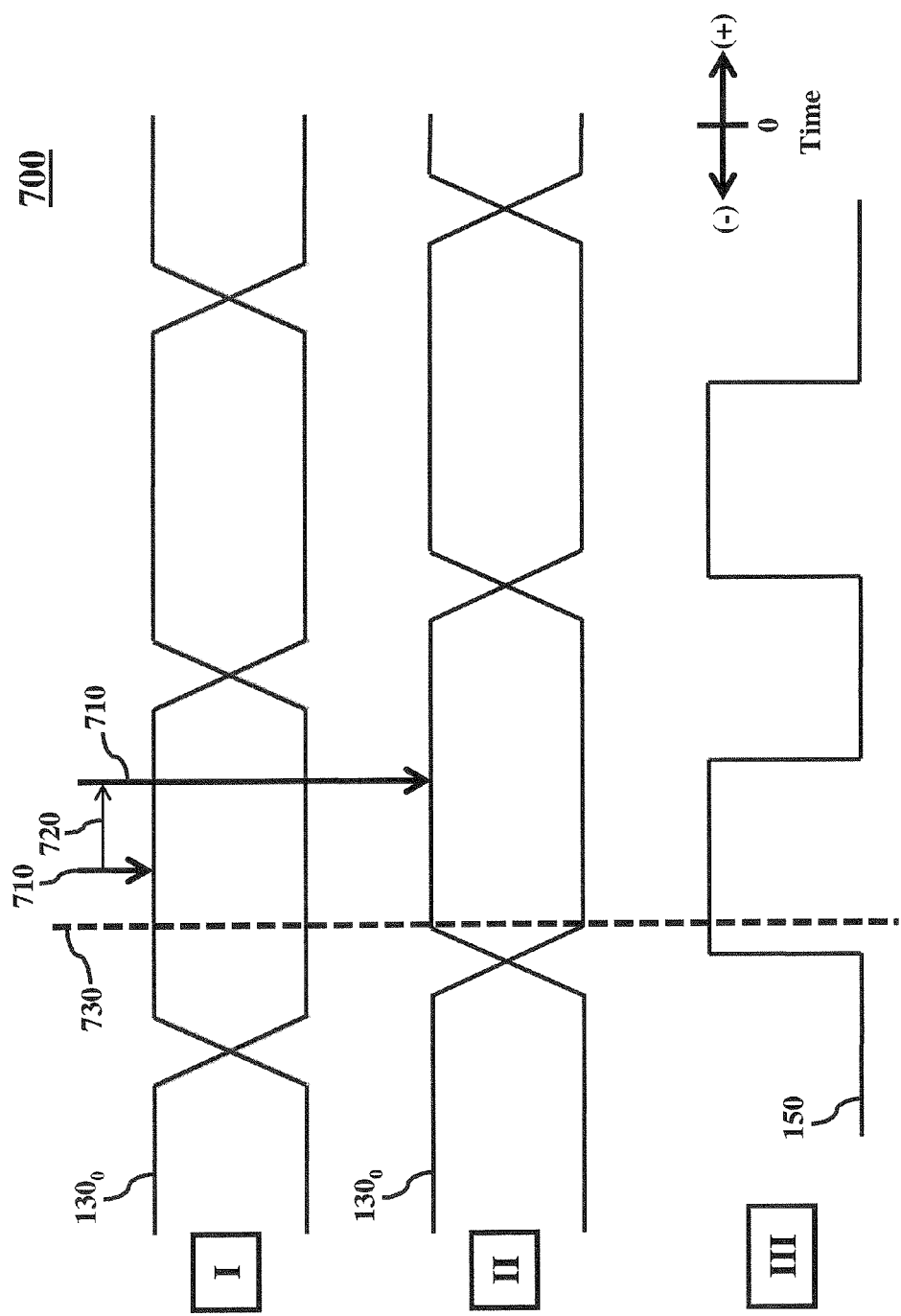
FIG. 7 is an illustration of an exemplary timing diagram to facilitate in an explanation of a flowchart to determine a first write timing boundary of a write timing period when first and second data patterns match each other.

FIG. 6 is an illustration of an embodiment of a flowchart 600 to determine the first timing boundary of the write timing window when the first and second data patterns match each other. An exemplary timing diagram 700 of FIG. 7 will be used to facilitate in the explanation of flowchart 600. In reference to timing diagram 700, timing diagrams I and III represent data signal $130_0$ and write clock signal 150, respectively. Here, memory device 420 can properly recover data from data signal $130_0$ since write clock signal 150 has a sufficient amount of time to sample data signal $130_0$ (e.g., a sufficient amount of time for memory device 420 to latch data signal $130_0$). This is similar to the timing relationship between data signal $130_0$ and write clock signal 150 described above with respect to FIG. 2. Timing diagram II of FIG. 7 is a phase-shifted representation of data signal $130_0$ and will be described below with respect to flowchart 600.

In reference to flowchart 600 of FIG. 6, the starting point of flowchart 600 considers the situation when the first data pattern matches the second data pattern. This is the case since, as noted above with respect to timing diagram 700, memory device 420 has a sufficient amount of time to sample data signal $130_0$. Accordingly, the bit information of the first data pattern (e.g., data pattern transmitted from processing unit 410 to memory device 420) is identical to the bit information of the second data pattern (e.g., data pattern stored in memory device 420), according to an embodiment of the present invention. In an embodiment, processing unit 410 executes the steps of flowchart 600 when determining the first timing boundary of the write timing window.

In step 610, processing unit 410 introduces a positive incremental phase shift to the first data pattern. In an embodiment, the incremental phase shift is defined as a fraction of a cycle of write clock signal 150. For instance, the fraction can be $\frac{1}{10}$, $\frac{1}{5}$, $\frac{3}{10}$, or $\frac{2}{5}$ of write clock signal 150. Further, in reference to timing diagram 700 of FIG. 7, the positive incremental phase shift is defined as an incremental phase shift in the "(+)" direction, according to an embodiment of the present invention.

In step 620, the phase-shifted first data pattern is transmitted to memory device 420 and stored in memory device 420.

In step 630, processing unit 410 receives the second data pattern from memory device 420. The second data pattern represents the phase-shifted first data pattern received at an interface of memory device 420 and stored in memory device 420.

In step 640, processing unit 410 compares the phase-shifted first data pattern to the second data pattern, where controller 450 stores the bit information of the phase-shifted first data pattern. Controller 450 compares the bit information from the phase-shifted first data pattern to bit information from the second data pattern, where the two data patterns are compared to each other on a bit-by-bit basis, according to an embodiment of the present invention.

In step 650, if the bit information from the first data pattern matches the bit information from the second data pattern, processing unit 410 introduces an additional positive incremental phase delay in the first data pattern (step 610) and steps 620-640 are repeated.

In step 660, if the bit information from the first and second data patterns do not match each other, then phase shift information from the prior phase-shifted first data pattern is stored in processing unit 410. In reference to timing diagram 700 of FIG. 7, timing diagram II represents a positive phase-shifted data signal $130_O$ (i.e., positive phase-shifted first data pattern). A marker 710 in timing diagrams I and II represents a reference point on data signal $130_O$ to indicate the positive incremental phase shifts in data signal $130_O$. Further, a marker 730 indicates a boundary condition for a relative phase shift between data signal $130_O$ and write clock signal 150, where if additional increments of positive phase shifts are introduced to data signal $130_O$ (in timing diagram II of FIG. 7), write clock signal 150 cannot be used to sample a valid data signal $130_O$. This is because, with any additional positive increments in the phase shift to data signal $130_O$, write clock signal 150 will not have a sufficient amount of time to sample data signal $130_O$ (e.g., a non-sufficient amount of time for memory device 420 to latch data signal $130_O$).

In reference to timing diagram 700 of FIG. 7, a time period 720 represents the first timing boundary of the write timing window according to an embodiment of the present invention. In particular, time period 720 is a boundary condition for a relative phase shift between data signal $130_O$ and write clock signal 150, in which data signal $130_O$ cannot have an additional positive increment in phase shift without risk of an improper data recovery by memory device 420. In an embodiment, in reference to an original phase position of data signal $130_O$ in relation to write clock signal 150 (e.g., marker 710 in timing diagram I of FIG. 7), data signal $130_O$ cannot have a positive phase shift more than time period 720 without risk of improper data recovery by memory device 420.

Figure 8:
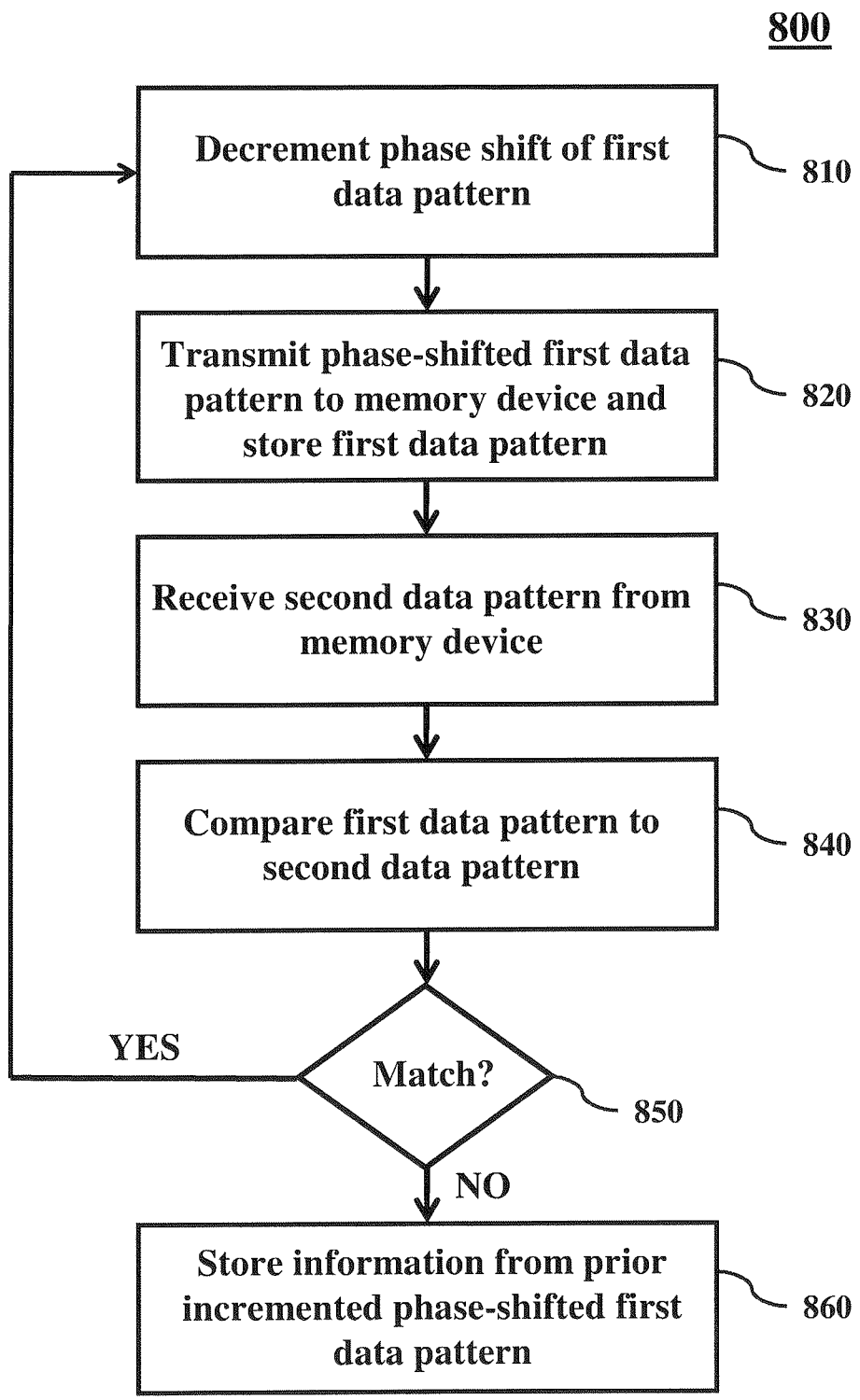
FIG. 8 is an illustration of a flowchart to determine a second write timing boundary of a write timing period when first and second data patterns match each other.
Figure 9:
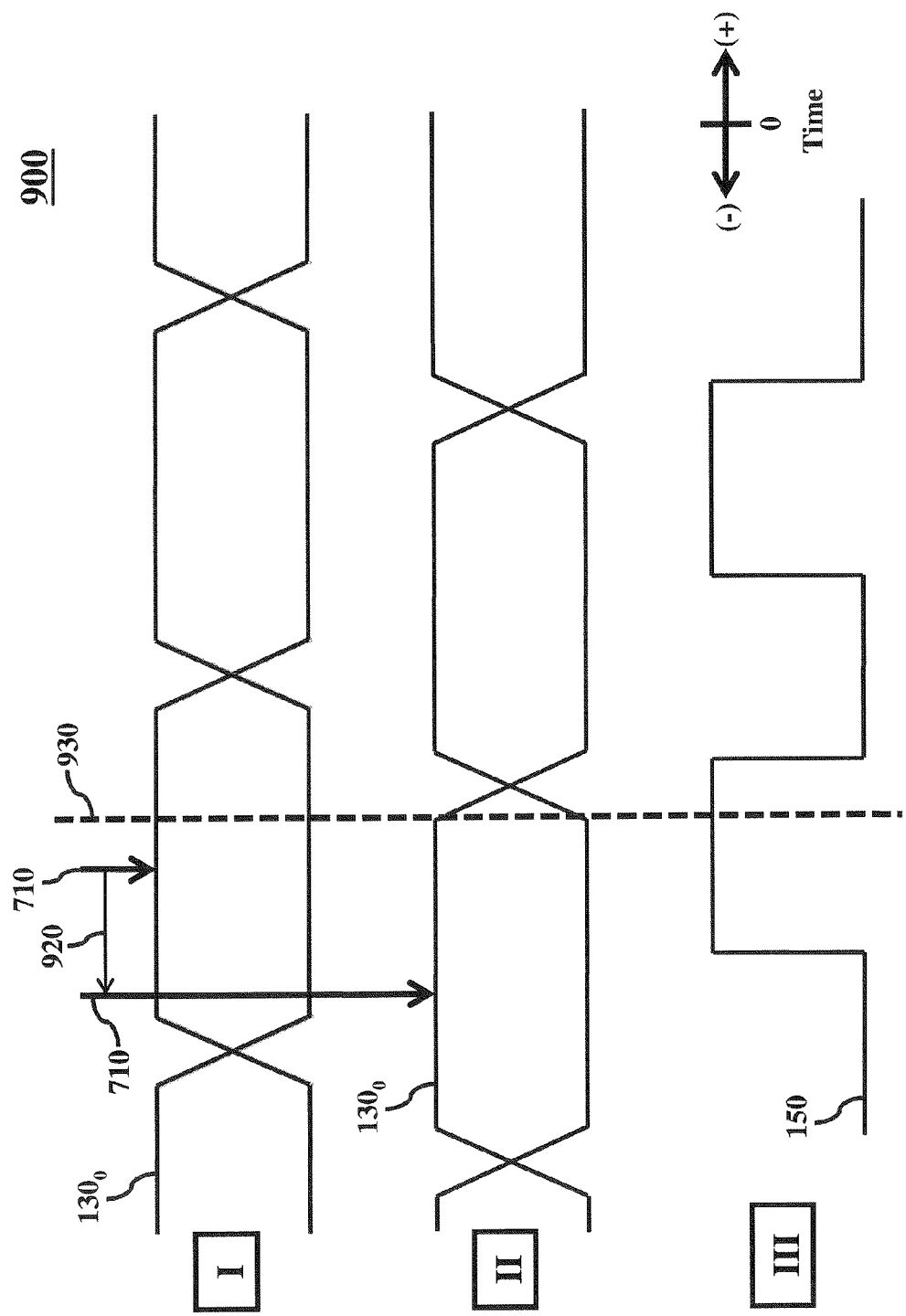
FIG. 9 is an illustration of an exemplary timing diagram to facilitate in an explanation of a flowchart to determine a second write timing boundary of a write timing period when first and second data patterns match each other.

FIG. 8 is an illustration of an embodiment of a flowchart 800 to determine the second boundary condition of the write timing window when the first and second data patterns match each other. An exemplary timing diagram 900 of FIG. 9 will be used to facilitate in the explanation of flowchart 800. In reference to timing diagram 900, timing diagrams I and III represent data signal $130_O$ and write clock signal 150, respectively. Here, similar to the timing relationship between data signal $130_O$ and clock signal 150 described above with respect to FIG. 2, memory device 420 can properly recover data from data signal $130_O$ since write clock signal 150 has a sufficient amount of time to sample data signal $130_O$ (e.g., a sufficient amount of time for memory device 420 to latch data signal $130_O$). Timing diagram II of FIG. 9 is a phase-shifted representation of data signal $130_O$ and will be described below with respect to flowchart 800.

The steps of flowchart 800 are similar to the steps of flowchart 600, except that the incremental phase shifts in the first data pattern are in the "(−)" direction. In particular, in step 810, processing unit introduces a negative incremental phase shift to the first data pattern. Steps 820-840 perform similar functions as steps 620-640 of flowchart 600, respectively.

In step 850, if the bit information from the first data pattern matches the bit information from the second data pattern, processing unit 410 introduces an additional negative incremental phase delay in the first data pattern (step 810) and steps 820-840 are repeated.

In step 860, if the bit information from the first and second data patterns do not match each other, then phase shift information from the prior phase-shifted first data pattern is stored in processing unit 410. In reference to timing diagram 900 of FIG. 9, timing diagram II represents a negative phase-shifted data signal $130_O$ (i.e., negative phase-shifted first data pattern). Marker 710 in timing diagrams I and II represents a reference point on data signal $130_O$ to indicate the negative incremental phase shifts in data signal $130_O$. Further, a marker 930 indicates a boundary condition for a relative phase shift between data signal $130_O$ and write clock signal 150, where if additional increments of negative phase shifts are introduced to data signal $130_O$ (in timing diagram II of FIG. 9), write clock signal 150 will not have a sufficient amount of time to sample data signal $130_O$ (e.g., a non-sufficient amount of time for memory device 420 to latch data signal $130_O$).

In reference to timing diagram 900 of FIG. 9, a time period 920 represents the second timing boundary of the write timing window according to an embodiment of the present invention. In particular, time period 920 is a boundary condition for a relative phase shift between data signal $130_O$ and write clock signal 150, in which data signal $130_O$ cannot have an additional negative increment in phase shift without risk of an improper data recovery by memory device 420. In an embodiment, in reference to an original phase position of data signal $130_O$ in relation to write clock signal 150 (e.g., marker 710 in timing diagram I of FIG. 9), data signal $130_O$ cannot have a negative phase shift more than time period 920 without risk of improper data recovery by memory device 420.

To summarize, with respect to FIGS. 6-9, the first and second timing boundaries of the write timing window have been defined in terms of a phase shift of data signal $130_O$ in relation to write clock signal 150. In an embodiment, from an original phase position of data signal $130_O$ in relation to write clock signal 150, the write timing window is bounded by the first and second timing boundaries. In an embodiment, the first timing boundary is defined as a maximal positive phase shift of data signal $130_O$ from its original phase position without improper data recovery by memory device 420. Further, the second timing boundary is defined as a maximal negative phase shift of data signal $130_O$ from its original phase position without improper data recovery by memory device 420, according to an embodiment of the present invention.

Based on the description above, in an embodiment, write clock signal 150 can also be used to determine the first and second boundaries of the write timing window. The following description of FIGS. 10 and 11 will be used to facilitate in the explanation of how steps similar to those of flowcharts 600 and 800, respectively, can be applied to write clock signal 150 when determining the first and second boundaries of the write timing window, according to an embodiment of the present invention.

Figure 10:
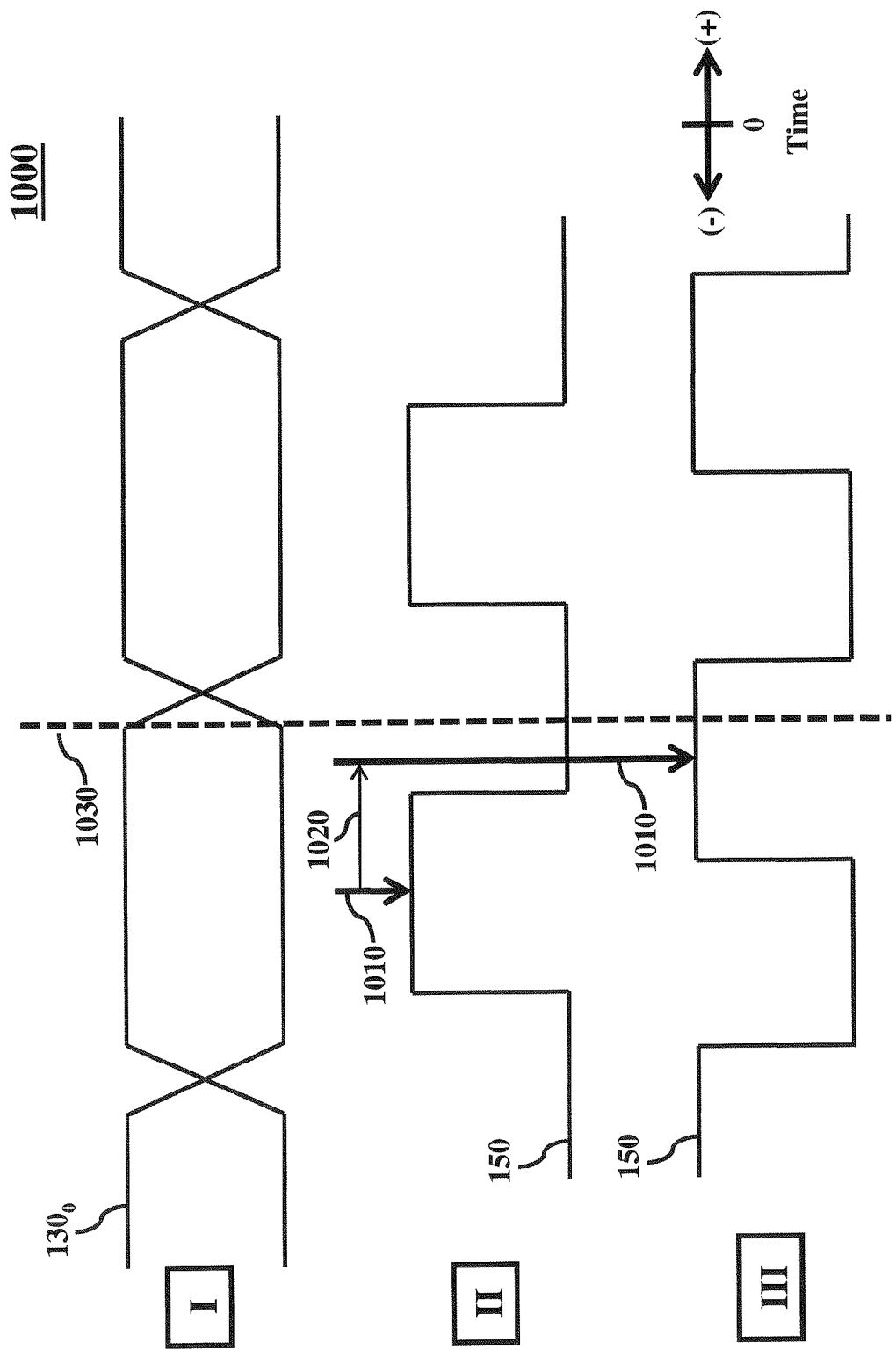
FIG. 10 is an illustration of an exemplary timing diagram to facilitate in an explanation of a determination of a first write timing boundary of a write timing period, based on a write clock signal, when first and second data patterns match each other.

FIG. 10 is an illustration of an exemplary write timing diagram 1000 that will be used to facilitate in the explanation how steps similar to those in flowchart 600 of FIG. 6 can be used to determine the first timing boundary of the write timing window based on write clock signal 150, according to an embodiment of the present invention. In reference to timing diagram 1000, timing diagrams I and II represent data signal $130_0$ and write clock signal 150, respectively. Here, similar to the timing relationship between data signal $130_0$ and clock signal 150 described above with respect to FIG. 2, memory device 420 can properly recover data from data signal $130_0$ since write clock signal 150 has a sufficient amount of time to sample data signal $130_0$ (e.g., a sufficient amount of time for memory device 420 to latch data signal $130_0$). Timing diagram III of FIG. 10 is a phase-shifted representation of write clock signal 150 and will be described in further detail below.

Similar to step 610 of FIG. 6, processing unit 410 introduces a positive incremental phase shift to write clock signal 150. Next, the transmission, receiving, and comparison steps of steps 620-640 can be applied to the positive phase-shifted write clock signal 150.

In reference to timing diagrams II and III of FIG. 10, a marker 1010 in timing diagrams II and III represents a reference point on write clock signal 150 to indicate the positive incremental phase shifts in write clock signal 150. Further, a marker 1030 indicates a boundary condition for a relative phase shift between data signal $130_0$ and write clock signal 150, where if additional increments of positive phase shifts are introduced to write clock signal 150 (in timing diagram III of FIG. 10), write clock signal 150 will not have a sufficient amount of time to sample data signal $130_0$ (e.g., a non-sufficient amount of time for memory device 420 to latch data signal $130_0$).

In reference to timing diagram 1000 of FIG. 10, a time period 1020 represents the first timing boundary of the write timing window, according to an embodiment of the present invention. In particular, time period 1020 is a boundary condition for a relative phase shift between data signal $130_0$ and write clock signal 150, in which write clock signal 150 cannot have an additional positive increment in phase shift without risk of an improper data recovery by memory device 420. In an embodiment, in reference to an original phase position of write clock signal 150 in relation to data signal $130_0$ (e.g., marker 1010 in timing diagram II of FIG. 10), write clock signal 150 cannot have a positive phase shift more than time period 1020 without risk of improper data recovery by memory device 420.

Figure 11:
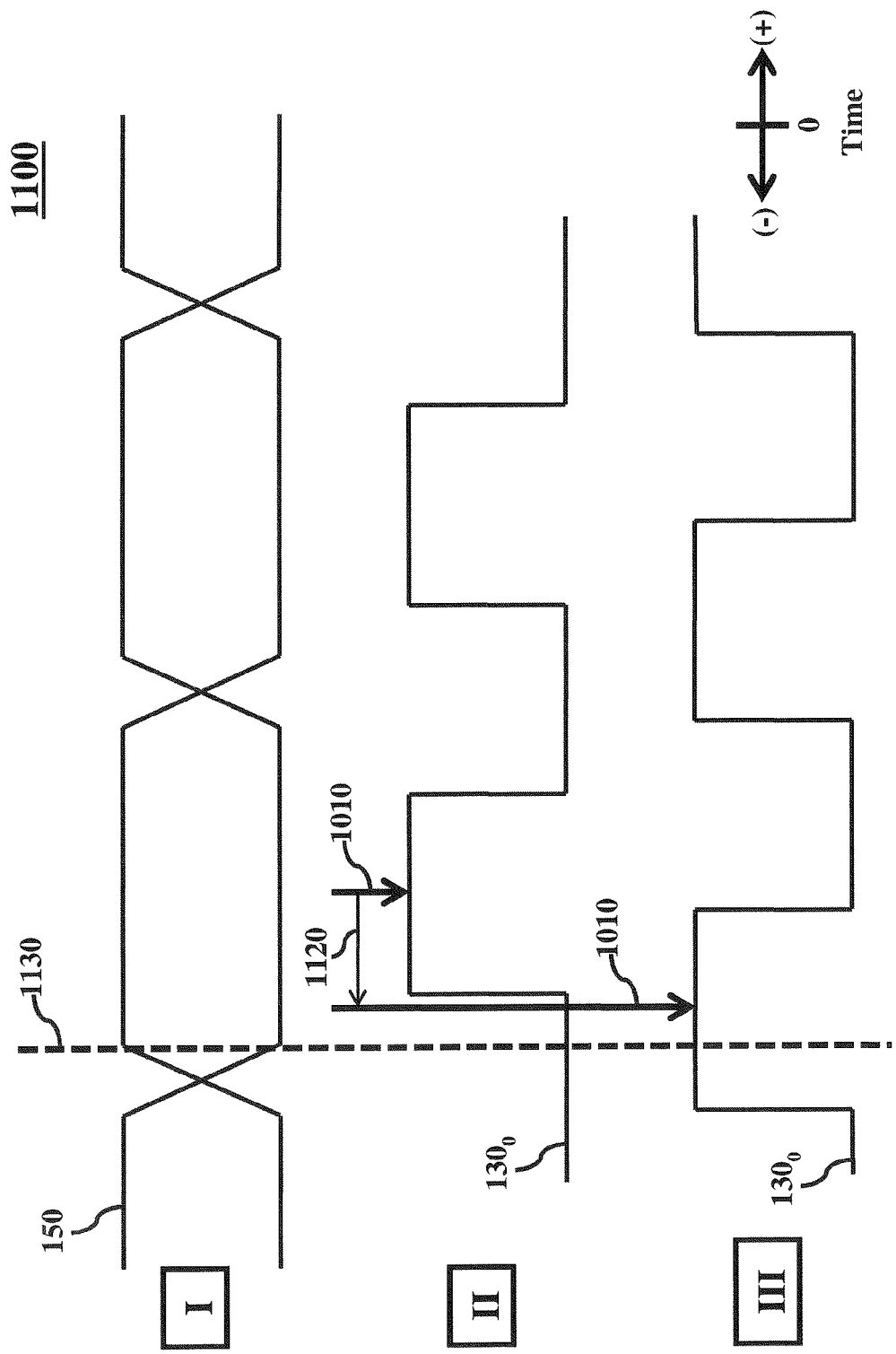
FIG. 11 is an illustration of an exemplary timing diagram to facilitate in an explanation of a determination of a second write timing boundary of a write timing period, based on a write clock signal, when first and second data patterns match each other.

FIG. 11 is an illustration of an exemplary write timing diagram 1100 that will be used to facilitate in the explanation how steps similar to those in flowchart 800 of FIG. 8 can be used to determine the second timing boundary of the write timing window based on write clock signal, according to an embodiment of the present invention. In reference to timing diagram 1100, timing diagrams I and II represent data signal $130_0$ and write clock signal 150, respectively. Here, similar to the timing relationship between data signal $130_0$ and clock signal 150 described above with respect to FIG. 2, memory device 420 can properly recover data from data signal $130_0$ since write clock signal 150 has a sufficient amount of time to sample data signal $130_0$ (e.g., a sufficient amount of time for memory device 420 to latch data signal $130_0$). Timing diagram III of FIG. 11 is a phase-shifted representation of write clock signal 150 and will be described in further detail below.

Similar to step 810 of FIG. 8, processing unit 410 introduces a negative incremental phase shift to write clock signal 150. Next, the transmission, receiving, and comparison steps of steps 820-840 can be applied to the negative phase-shifted write clock signal 150.

In reference to timing diagrams II and III of FIG. 11, marker 1010 in timing diagrams II and III represents a reference point on write clock signal 150 to indicate the negative incremental phase shifts in write clock signal 150. Further, a marker 1130 indicates a boundary condition for a relative phase shift between data signal $130_0$ and write clock signal 150, where if additional increments of negative phase shifts are introduced to write clock signal 150 (in timing diagram III of FIG. 11), write clock signal 150 will not have a sufficient amount of time to sample a valid data signal $130_0$ (e.g., a non-sufficient amount of time for memory device 420 to latch data signal $130_0$).

In reference to timing diagram 1100 of FIG. 11, a time period 1120 represents the second timing boundary of the write timing window, according to an embodiment of the present invention. In particular, time period 1120 is a boundary condition for a relative phase shift between data signal $130_0$ and write clock signal 150, in which write clock signal 150 cannot have an additional negative increment in phase shift without risk of an improper data recovery by memory device 420. In an embodiment, in reference to an original phase position of write clock signal 150 in relation to data signal $130_0$ (e.g., marker 1010 in timing diagram II of FIG. 11), write clock signal 150 cannot have a negative phase shift more than time period 1120 without risk of improper data recovery by memory device 420.

To summarize, with respect to FIGS. 10 and 11, the first and second timing boundaries of the write timing window have been defined in terms of a phase shift of write clock signal 150 in relation to data signal $130_0$. In an embodiment, from an original phase position of write clock signal 150 in relation to data signal $130_0$, the write timing window is bounded by the first and second timing boundaries. In an embodiment, the first timing boundary is defined as a maximal positive phase shift of write clock signal 150 from its original phase position without improper data recovery by memory device 420. Further, the second timing boundary is defined as a maximal negative phase shift of write clock signal 150 from its original phase position without improper data recovery by memory device 420, according to an embodiment of the present invention.

The description above, with respect to FIGS. 6-11, describes techniques on determining the first and second boundaries of the write timing window when the first and second data patterns match each other. In the embodiments described above, either data signal $130_0$ or write clock signal 150 is adjusted by incremental phase shifts such that the relative phase alignment between the two signals allow a proper data recovery by memory device 420. Based on the description herein, a person of ordinary skill in the art will recognize that data signal $130_0$ and write clock signal 150 can be both adjusted with, for example, a proper combination of positive and negative incremental phase shifts such that the relative phase alignment between the two signals allow a proper data recovery by memory device 420.

The following description with respect to FIGS. 12-17 describes the determination of the first and second timing boundaries of the write timing window when the first and second data patterns do not match each other.

Figure 12:
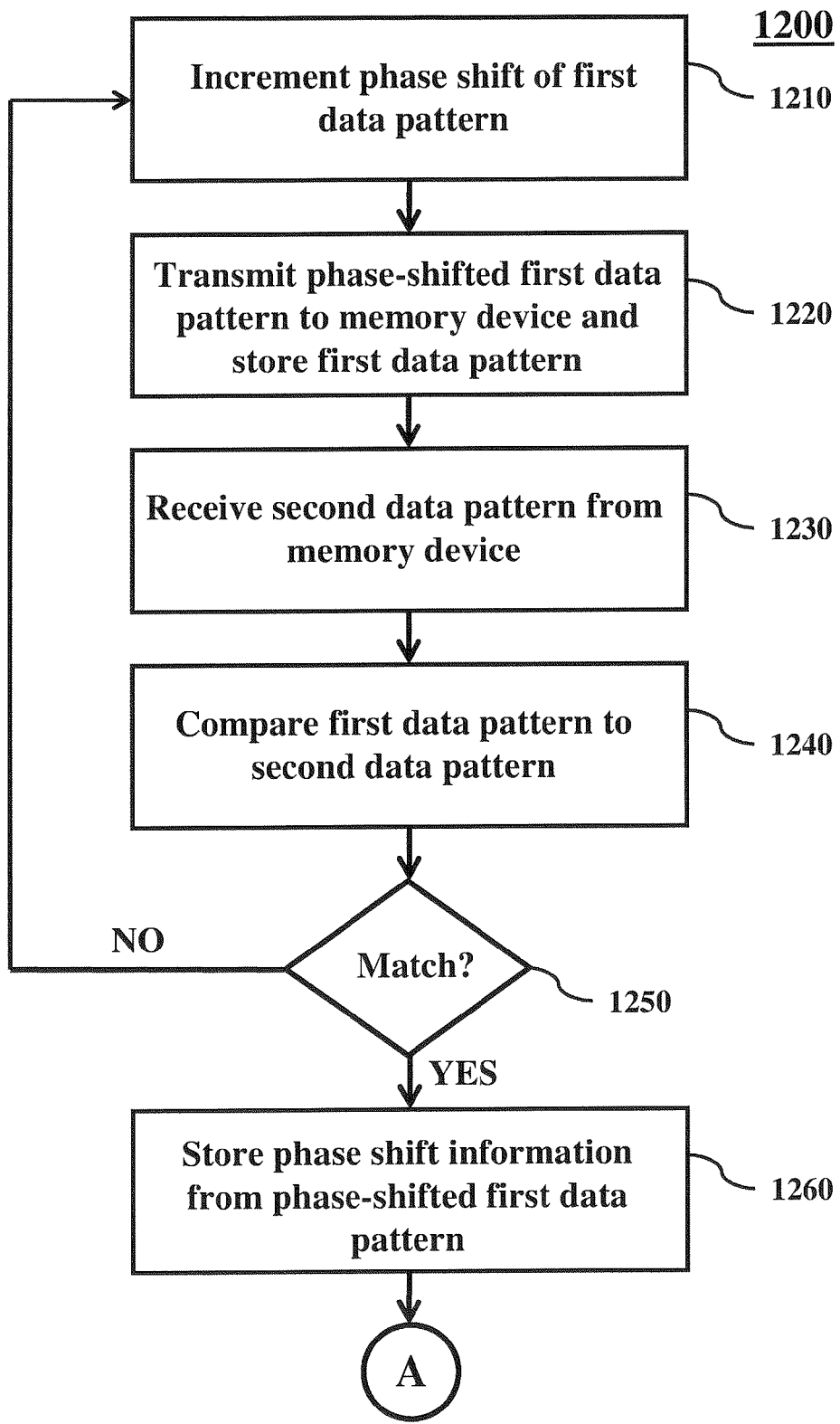
FIG. 12 is an illustration of a flowchart to determine a first write timing boundary of a write timing period when first and second data patterns do not match each other.

FIG. 12 is an illustration of an embodiment of a flowchart 1200 to determine the first timing boundary of the write timing window when first and second data patterns do not match each other. An exemplary timing diagram 1300 of FIG. 13 will be used to facilitate in the explanation of flowchart

Figure 13:
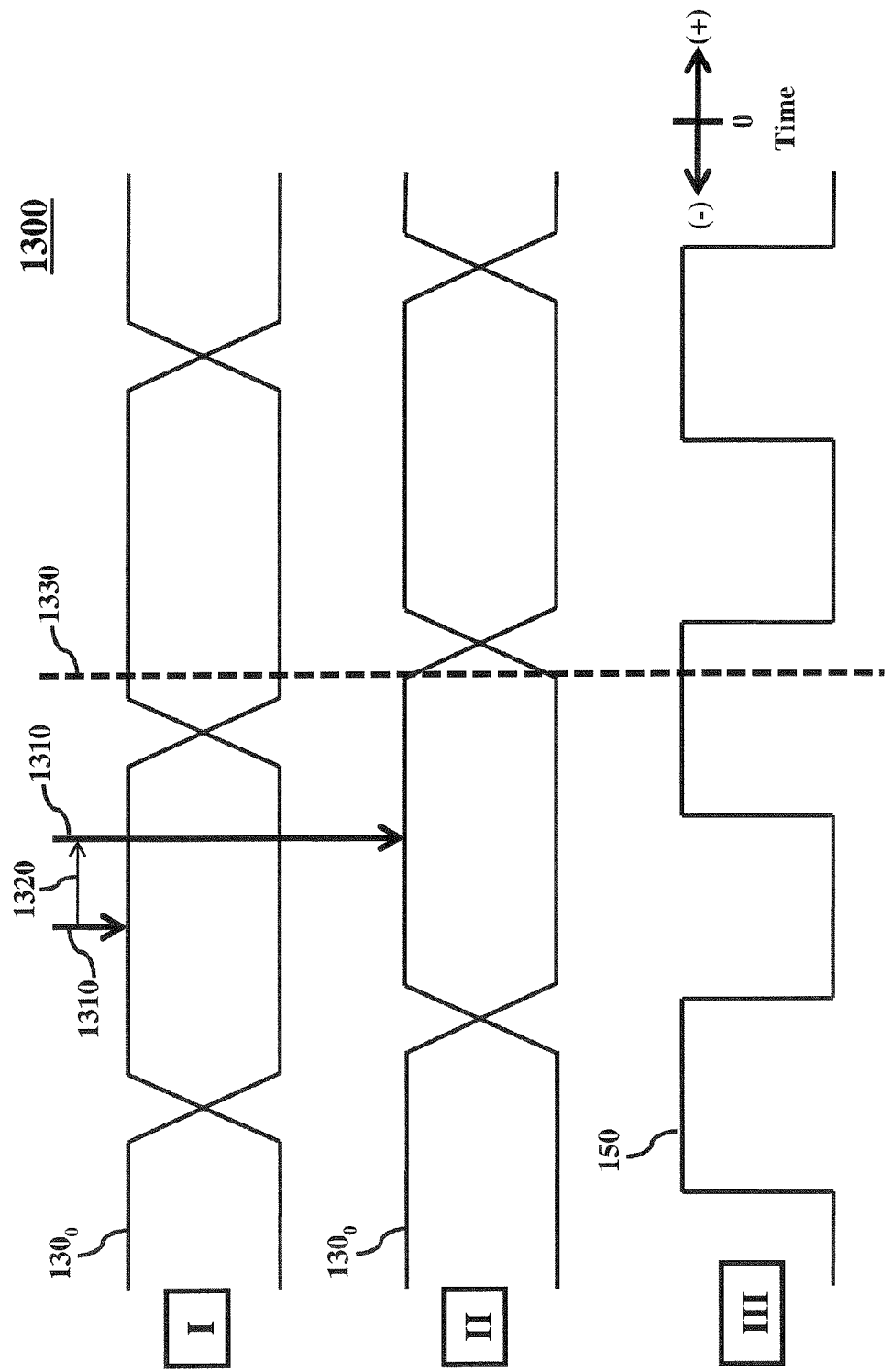
FIG. 13 is an illustration of exemplary timing diagram to facilitate in an explanation of a flowchart to determine a first write timing boundary of a write timing period when first and second data patterns do not match each other.

1200. In reference to timing diagram 1300, timing diagrams I and III represent data signal $130_O$ and write clock signal 150, respectively. Here, memory device 420 does not properly recover data signal $130_O$ since write clock signal 150 does not have a sufficient amount of time to sample data signal $130_O$ (e.g., a non-sufficient amount of time for memory device 420 to latch data signal $130_O$). This is similar to the timing relationship between data signal $130_O$ and clock signal 150 described above with respect to FIG. 3. Timing diagram II of FIG. 13 is a phase-shifted representation of data signal $130_O$ and will be described below with respect to flowchart 1200.

In reference to flowchart 1200 of FIG. 12, the starting point of flowchart 1200 considers the situation when the first data pattern does not match the second data pattern. This is the case since, as noted above with respect to timing diagram 1300, memory device 420 does not have a sufficient amount of time to sample data signal $130_O$. Accordingly, the bit information of the first data pattern (e.g., data pattern transmitted from processing unit 410 to memory device 420) is not identical to the bit information of the second data pattern (e.g., data pattern stored in memory device 420), according to an embodiment of the present invention. In an embodiment, processing unit 410 executes the steps of flowchart 1200 when determining the first timing boundary of the write timing window.

In step 1210, processing unit 410 introduces a positive incremental phase shift to the first data pattern.

In step 1220, the phase-shifted first data pattern is transmitted to memory device 420 and stored in memory device 420.

In step 1230, processing unit 410 receives the second data pattern from memory device 420. The second data pattern represents the phase-shifted first data pattern received at an interface of memory device 420 and stored in memory device 420.

In step 1240, processing unit 410 compares the phase-shifted first data pattern to the second data pattern, where controller 450 stores the bit information of the phase shifted first data pattern. Controller 450 compares the bit information from the phase-shifted first data pattern to bit information from the second data pattern, where the two data patterns are compared to each other on a bit-by-bit basis, according to an embodiment of the present invention.

In step 1250, if the bit information from the first data pattern does not match the bit information from the second data pattern, processing unit 410 introduces an additional positive incremental phase delay in the first data pattern (step 1210) and steps 1220-1240 are repeated.

In step 1260, if the bit information from the first and second data patterns match each other, then phase shift information from the phase-shifted first data pattern is stored in processing unit 410. In reference to timing diagram 1300 of FIG. 13, timing diagram II represents a positive phase-shifted data signal $130_O$ (i.e., positive phase-shifted first data pattern). A marker 1310 in timing diagrams I and II represents a reference point on data signal $130_O$ to indicate the positive incremental phase shifts in data signal $130_O$. Further, a marker 1330 indicates a boundary condition for a relative phase shift between data signal $130_O$ and write clock signal 150, where if additional increments of positive phase shifts are introduced to data signal $130_O$ (in timing diagram II of FIG. 13), write clock signal 150 can be used to sample a valid data signal $130_O$. This is because, with any additional positive increments in the phase shift of data signal $130_O$, write clock signal 150 would have sufficient time to sample a valid data signal $130_O$.

In reference to timing diagram 1300 of FIG. 13, a time period 1320 represents the first timing boundary of the write timing window, according to an embodiment of the present invention. In particular, time period 1320 is a boundary condition for a relative phase shift between data signal $130_O$ and write clock signal 150, in which data signal $130_O$ can have an additional positive increment in phase shift and memory device 420 can properly recover data signal $130_O$. In an embodiment, in reference to an original phase position of data signal $130_O$ in relation to write clock signal 150 (e.g., marker 1310 in timing diagram I of FIG. 13), data signal $130_O$ is required to have at least a positive phase shift of time period 1320 in order for memory device 420 to properly recover data signal $130_O$.

Figure 14:
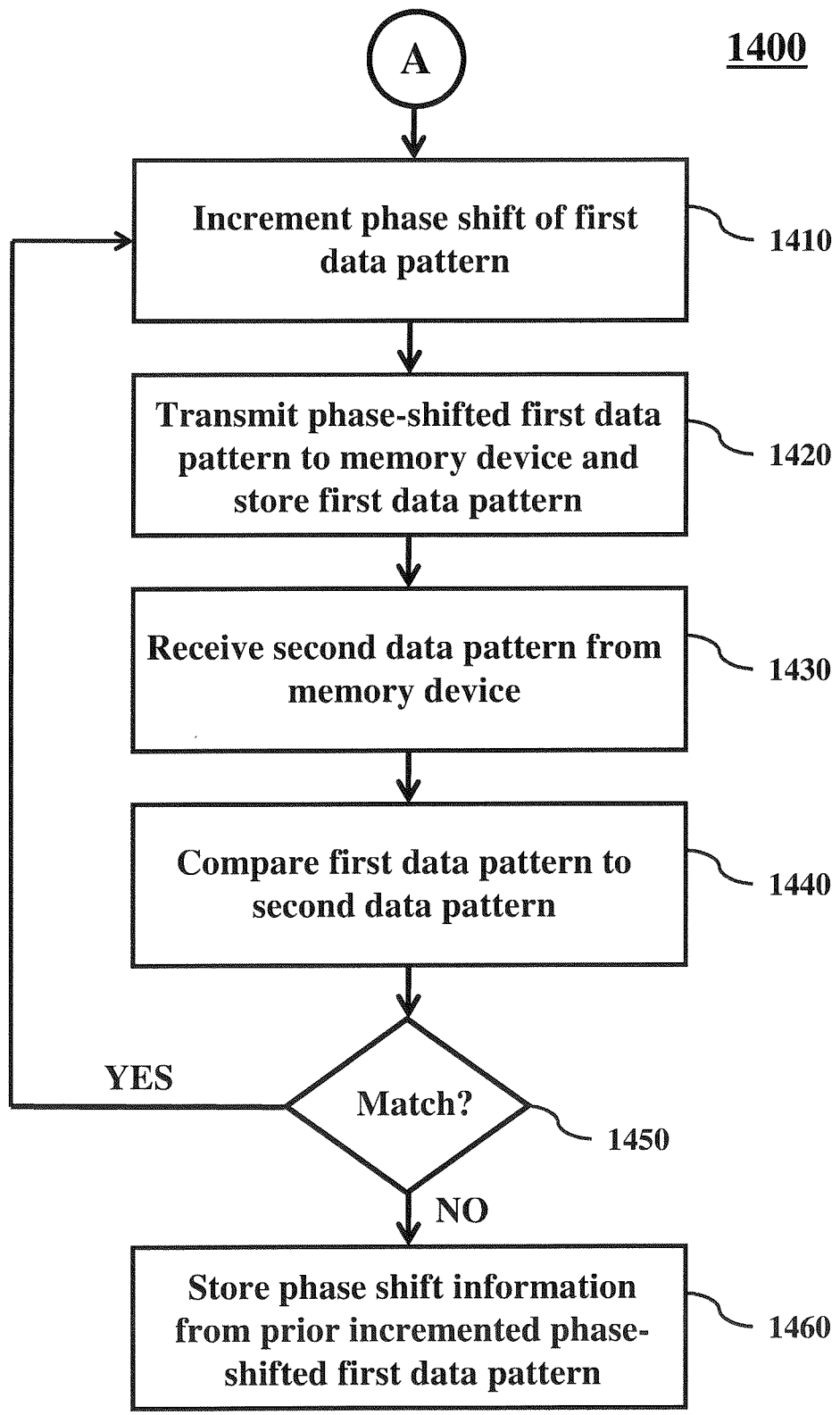
FIG. 14 is an illustration a flowchart to determine a second write timing boundary of a write timing period when first and second data patterns do not match each other.
Figure 15:
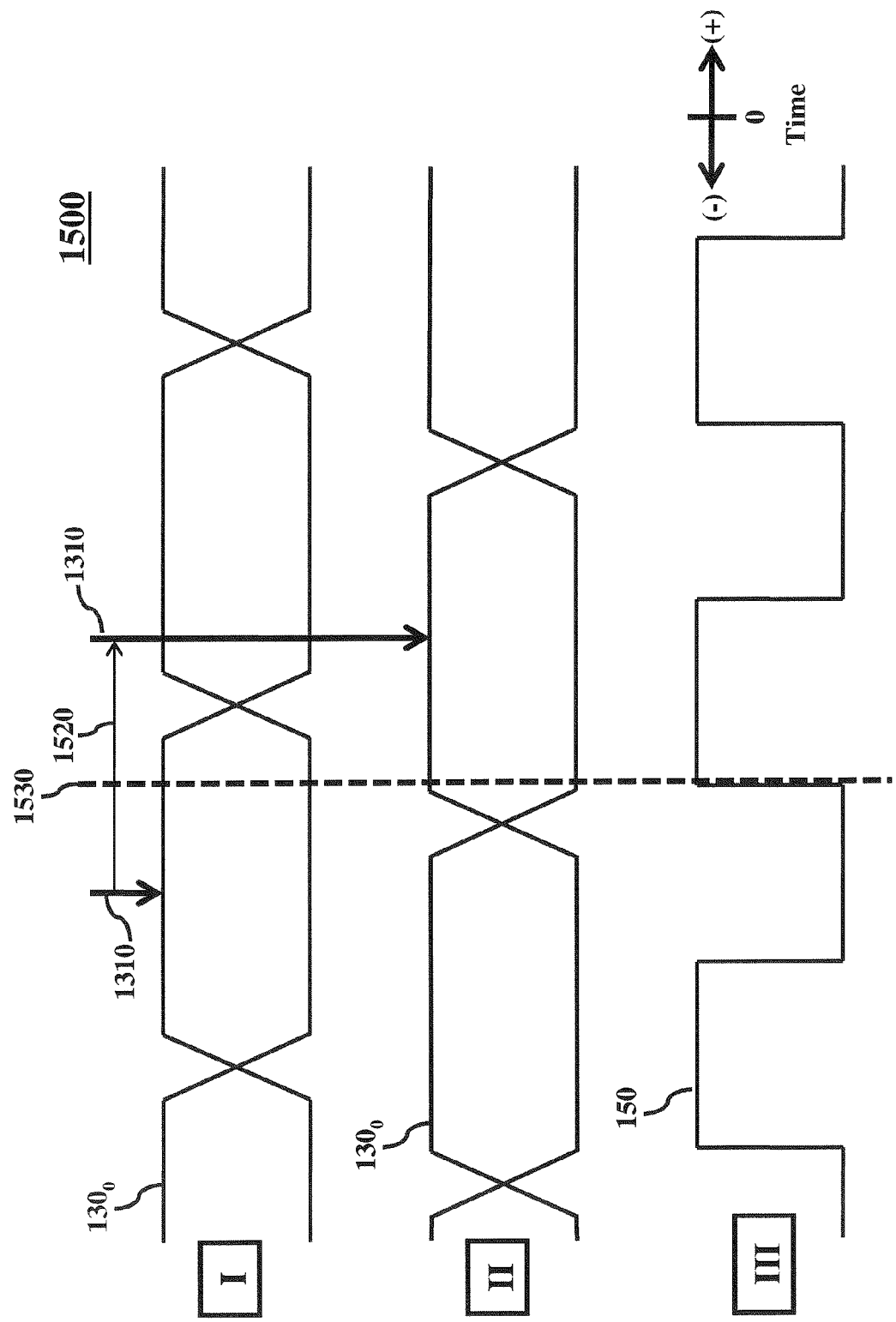
FIG. 15 is an illustration of an exemplary timing diagram to facilitate in an explanation of a flowchart to determine a second write timing boundary of a write timing period when first and second data patterns do not match each other.

FIG. 14 is an illustration of an embodiment of a flowchart 1400 to determine the second boundary condition of the write timing window when the first and second data patterns do not match each other. An exemplary timing diagram 1500 of FIG. 15 will be used to facilitate in the explanation of flowchart 1400. In reference to timing diagram 1500, timing diagrams I and III represent data signal $130_O$ and write clock signal 150, respectively. Here, similar to the timing relationship between data signal $130_O$ and write clock signal 150 described above with respect to FIG. 3, memory device 420 does not properly recover data from data signal $130_O$ since write clock signal 150 does not have a sufficient amount of time to sample data signal $130_O$ (e.g., a non-sufficient amount of time for memory device 420 to latch data signal $130_O$). Timing diagram II of FIG. 15 is a phase-shifted representation of data signal $130_O$ and will be described below with respect to flowchart 1400.

In an embodiment, the starting point for flowchart 1400 is from the positive phase shift of data signal $130_O$ corresponding to the first write timing boundary described above with respect to flowchart 1200 of FIG. 12 and timing diagram 1300 of FIG. 13.

The steps of flowchart 1400 are similar to the steps of flowchart 1200. In an embodiment, steps 1420-1440 perform similar functions as steps 1220-1240 of flowchart 1200, respectively.

In step 1450, if the bit information from the first data pattern matches the bit information from the second data pattern, processing unit 410 introduces an additional positive incremental phase delay in the first data pattern (step 1410) and steps 1420-1440 are repeated.

In step 1460, if the bit information from the first and second data patterns do not match each other, then phase shift information from the prior phase-shifted first data pattern is stored in processing unit 410. In reference to timing diagram 1500 of FIG. 15, timing diagram II represents a positive phase-shifted data signal $130_O$ (i.e., positive phase-shifted first data pattern). Marker 1310 in timing diagrams I and II represents a reference point on data signal $130_O$ to indicate the positive incremental phase shifts in data signal $130_O$. Further, a marker 1530 indicates a boundary condition for a relative phase shift between data signal $130_O$ and write clock signal 150, where if additional increments of positive phase shifts are introduced to data signal $130_O$ (in timing diagram II of FIG. 15), write clock signal 150 will sample an invalid data signal $130_O$ (e.g., a transition state of data signal $130_O$).

In reference to timing diagram 1500 of FIG. 15, a time period 1520 represents the second timing boundary of the write timing window, according to an embodiment of the present invention. In particular, time period 1520 is a boundary condition for a relative phase shift between data signal $130_O$ and write clock signal 150, in which data signal $130_O$ cannot have an additional positive increment in phase shift without risk of an improper data recovery by memory device 420. In an embodiment, in reference to an original phase position of data signal $130_O$ in relation to write clock signal 150 (e.g., marker 1310 in timing diagram I of FIG. 15), data signal $130_O$ cannot have a positive phase shift more than time period 1520 without risk of improper data recovery by memory device 420.

To summarize, with respect to FIGS. 12-15, the first and second timing boundaries of the write timing window have been defined in terms of a phase shift of data signal $130_O$ in relation to write clock signal 150. In an embodiment, from an original phase position of data signal $130_O$ in relation to write clock signal 150, the write timing window is bounded by the first and second timing boundaries. In an embodiment, the first timing boundary is defined as a minimal positive phase shift of data signal $130_O$ from its original phase position with proper data recovery by memory device 420. Further, the second timing boundary is defined as a maximal positive phase shift of data signal $130_O$ from its original phase position with proper data recovery by memory device 420, according to an embodiment of the present invention.

Based on the description above, in an embodiment, write clock signal 150 can also be used to determine the first and second boundaries of the write timing window. The following description of FIGS. 16 and 17 will be used to facilitate in the explanation of how steps similar to those of flowcharts 1200 and 1400, respectively, can be applied to write clock signal 150 when determining the first and second boundaries of the write timing window, according to an embodiment of the present invention.

Figure 16:
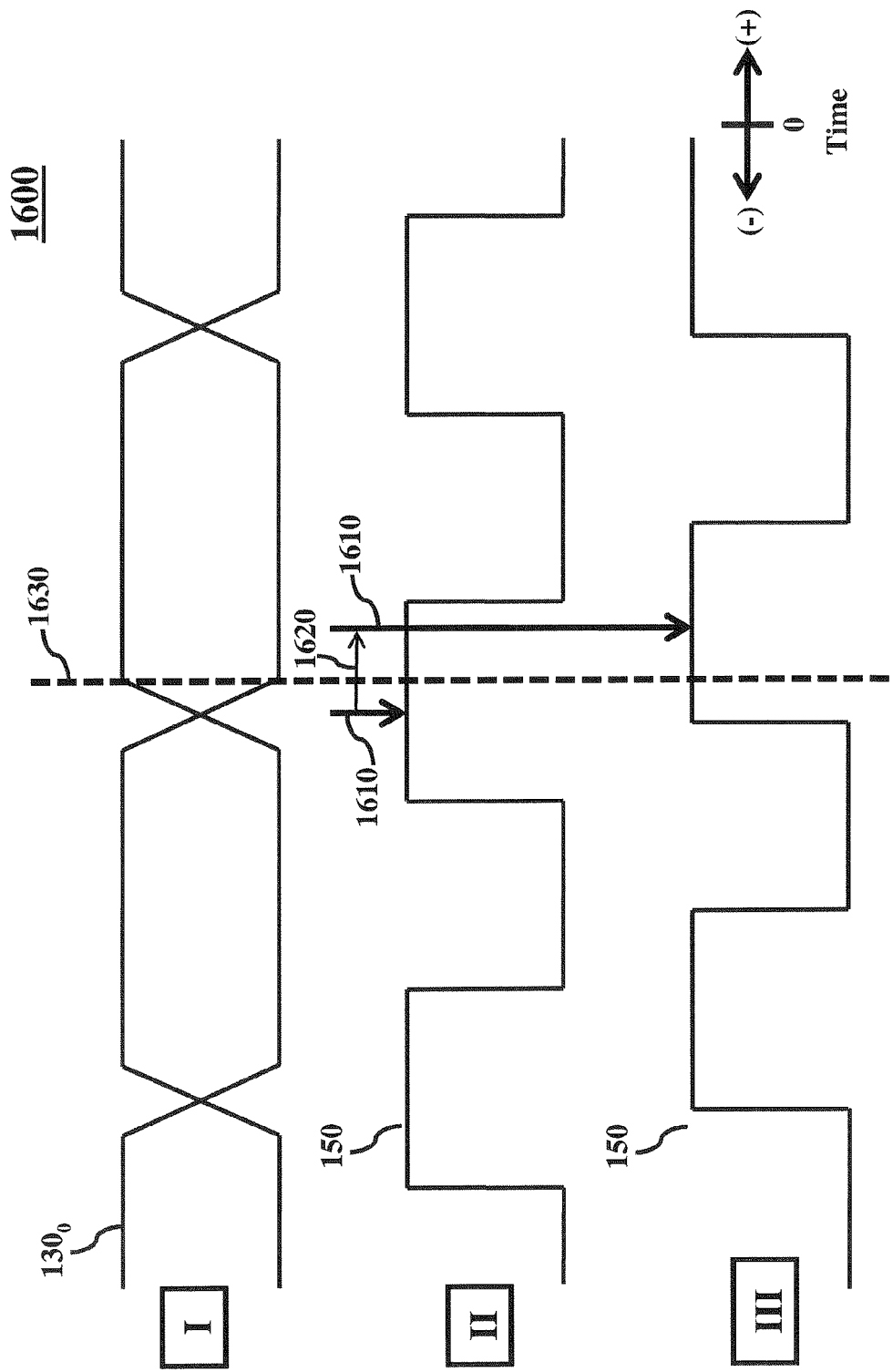
FIG. 16 is an illustration of an exemplary timing diagram to facilitate in an explanation of a determination of a first write timing boundary of a write timing period, based on a write clock signal, when first and second data patterns do not match each other.

FIG. 16 is an illustration of an exemplary write timing diagram 1600 that will be used to facilitate in the explanation how steps similar to those in flowchart 1200 of FIG. 12 can be used to determine the first timing boundary of the write timing window based on write clock signal 150, according to an embodiment of the present invention. In reference to timing diagram 1600, timing diagrams I and II represent data signal $130_O$ and write clock signal 150, respectively. Here, similar to the timing relationship between data signal $130_O$ and clock signal 150 described above with respect to FIG. 3, memory device 420 does not properly recover data from data signal $130_O$ since write clock signal 150 does not have a sufficient amount of time to sample data signal $130_O$ (e.g., a non-sufficient amount of time for memory device 420 to latch data signal $130_O$). Timing diagram III of FIG. 16 is a phase-shifted representation of write clock signal 150 and will be described in further detail below.

Similar to step 1210 of FIG. 12, processing unit 410 introduces a positive incremental phase shift to write clock signal 150. Next, the transmission, receiving, and comparison steps of steps 1220-1240 can be applied to the positive phase-shifted write clock signal 150.

In reference to timing diagrams II and III of FIG. 16, a marker 1610 in timing diagrams II and III represents a reference point on write clock signal 150 to indicate the positive incremental phase shifts in write clock signal 150. Further, a marker 1630 indicates a boundary condition for a relative phase shift between data signal $130_O$ and write clock signal 150, where if additional increments of positive phase shifts are introduced to write clock signal 150 (in timing diagram II of FIG. 16), write clock signal 150 will have a sufficient amount of time to sample data signal $130_O$ (e.g., a sufficient amount of time for memory device 420 to latch data signal $130_O$).

In reference to timing diagram 1600 of FIG. 16, a time period 1620 represents the first timing boundary of the write timing window, according to an embodiment of the present invention. In particular, time period 1620 is a boundary condition for a relative phase shift between data signal $130_O$ and write clock signal 150, in which write clock signal 150 can have an additional positive increment in phase shift and memory device 420 can properly recover data signal $130_O$. In an embodiment, in reference to an original phase position of write clock signal 150 in relation to data signal $130_O$ (e.g., marker 1610 in timing diagram II of FIG. 16), write clock signal 150 is required to have at least a positive phase shift of time period 1620 in order for memory device 420 to properly recover data signal $130_O$.

Figure 17:
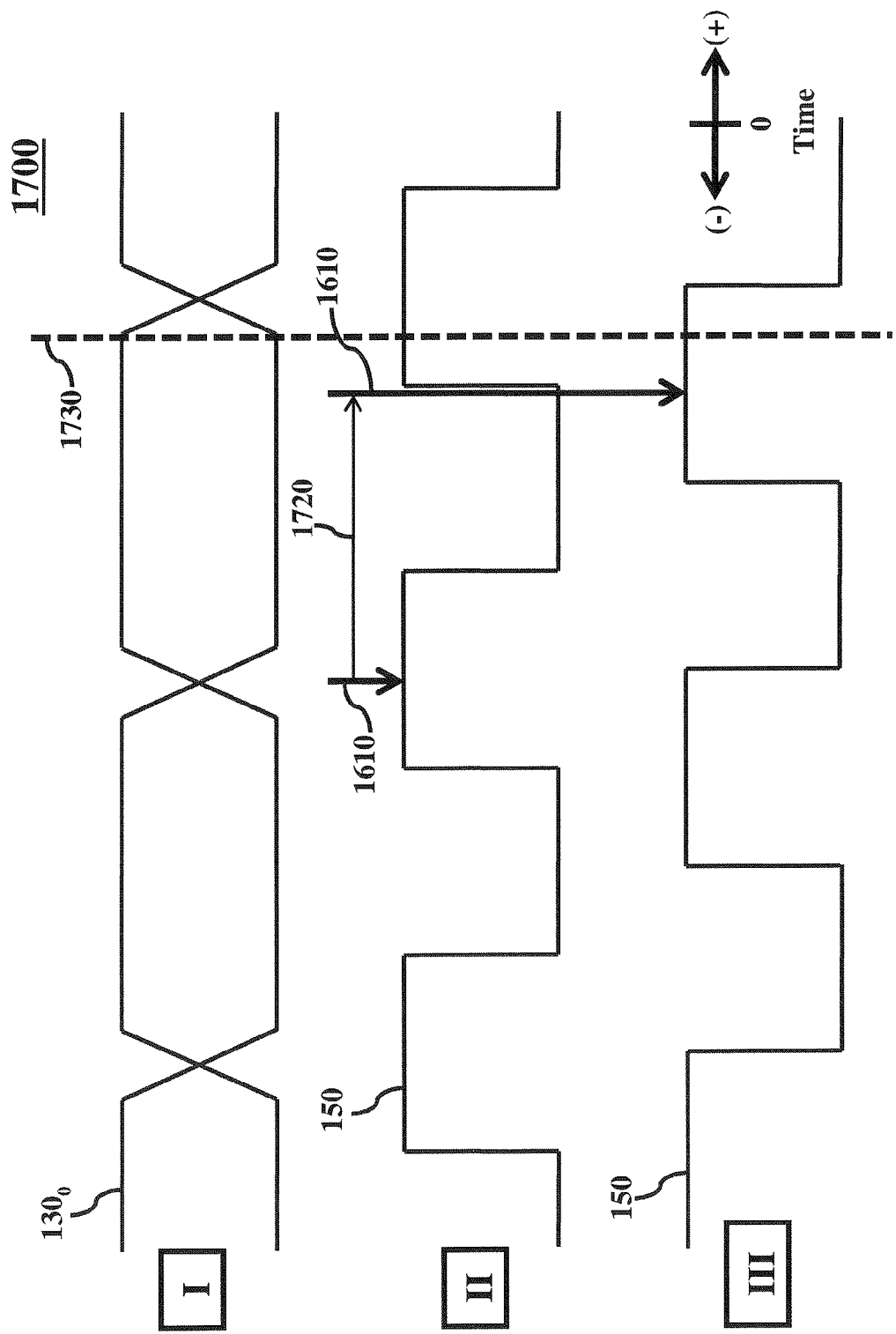
FIG. 17 is an illustration of an exemplary timing diagram to facilitate in an explanation of a determination of a second write timing boundary of a write timing period, based on a write clock signal, when first and second data patterns do not match each other.

FIG. 17 is an illustration of an exemplary write timing diagram 1700 that will be used to facilitate in the explanation how steps similar to those in flowchart 1400 of FIG. 14 can be used to determine the second timing boundary of the write timing window based on write clock signal 150, according to an embodiment of the present invention. In reference to timing diagram 1700, timing diagrams I and II represent data signal $130_O$ and write clock signal 150, respectively. Here, similar to the timing relationship between data signal $130_O$ and clock signal 150 described above with respect to FIG. 3, memory device 420 does not properly recover data from data signal $130_O$ since write clock signal 150 does not have a sufficient amount of time to sample data signal $130_O$ (e.g., a non-sufficient amount of time for memory device 420 to latch data signal $130_O$). Timing diagram III of FIG. 17 is a phase-shifted representation of write clock signal 150 and will be described in further detail below.

In an embodiment, similar to flowchart 1400, the starting point for write timing diagram 1700 is from the positive phase shift of data signal $130_O$ corresponding to the first write timing boundary described above with respect to timing diagram 1600 of FIG. 16.

Similar to step 1410 of FIG. 14, processing unit 410 introduces a positive incremental phase shift to write clock signal 150. Next, the transmission, receiving, and comparison steps of steps 1420-1440 can be applied to the positive phase-shifted clock write signal 150.

In reference to timing diagrams II and III of FIG. 17, marker 1610 in timing diagrams II and III represents a reference point on write clock signal 150 to indicate the positive incremental phase shifts in write clock signal 150. Further, a marker 1730 indicates a boundary condition for a relative phase shift between data signal $130_O$ and write clock signal 150, where if additional increments of positive phase shifts are introduced to write clock signal 150, write clock signal 150 will not have a sufficient amount of time to sample a valid data signal $130_O$ (e.g., a non-sufficient amount of time for memory device 420 to latch data signal $130_O$).

In reference to timing diagram 1700 of FIG. 17, a time period 1720 represents the second timing boundary of the write timing window, according to an embodiment of the present invention. In particular, time period 1720 is a boundary condition for a relative phase shift between data signal $130_O$ and write clock signal 150, in which write clock signal 150 cannot have an additional positive increment in phase shift without risk of an improper data recovery by memory device 420. In an embodiment, in reference to an original phase position of write clock signal 150 in relation to data signal $130_O$ (e.g., marker 1610 in timing diagram II of FIG. 17), write clock signal 150 cannot have a positive phase shift more than time period 1720 without risk of improper data recovery by memory device 420.

To summarize, with respect to FIGS. 16 and 17, the first and second timing boundaries of the write timing window have been defined in terms of a phase shift of write clock signal 150 in relation to data signal $130_O$. In an embodiment, from an original phase position of write clock signal 150 in relation to data signal $130_O$, the write timing window is bounded by the first and second timing boundaries. In an embodiment, the first timing boundary is defined as a minimal positive phase shift of write clock signal 150 from its original phase position with proper data recovery by memory device 420. Further, the second timing boundary is defined as a maximal positive phase shift of write clock signal 150 from its original phase position with proper data recovery by memory device 420, according to an embodiment of the present invention.

The description above, with respect to FIGS. 12-17, describes techniques on determining the first and second boundaries of the write timing window when the first and second data patterns do not match each other. In the embodiments described above, either data signal $130_0$ or write clock signal 150 is adjusted by positive incremental phase shifts such that the relative phase alignment between the two signals allow a proper data recovery by memory device 420. Based on the description herein, a person of ordinary skill in the art will recognize that data signal $130_0$ and write clock signal 150 can each be adjusted by negative incremental phase shifts to determine the write timing window and to achieve a proper phase alignment between the two signals. In addition, based on the description herein, a person of ordinary skill in the art will recognize that data signal $130_0$ and write clock signal 150 can be both adjusted with, for example, a proper combination of positive and negative incremental phase shifts such that the relative phase alignment between the two signals allows a proper data recovery by memory device 420.

The above description of embodiments of step 520 take into consideration pass/fail conditions of a write operation in order to assess the first and second boundaries of the write timing window. Based on the description herein, a person of ordinary skill in the relevant will recognize that the write timing window can be narrower than boundaries established by the pass/fail conditions of the above-described read/write operations. For instance, since the training mode of operation uses particular memory resources (e.g., data bus $130_7$-$130_0$, A/C bus $140_{15}$-$140_0$, and write clock signal 150), computer system 400 of FIG. 4 may require these memory resources to perform other modes of operation such as, for example, read and write operations. In this situation, it may be desirable to shorten the number of read/write iterations in the training mode of operation such that the performance of computer system 400 is not affected. The number of read/write operations can be a predetermined value based on the performance of computer system 400, where the predetermined value does not affect system performance when the relevant memory resources are used during the training mode of operation, according to an embodiment of the present invention. In an embodiment, the number of read/write operations can be based on a predetermined value that ensures an appropriate timing window from a reference point (e.g., a predetermined number of incremental phase shifts in both "(+)" and "(−)" direction from the original timing position of the first data pattern).

In reference to method 500 of FIG. 5, in step 530, processing unit 410 adjusts a phase difference between signals traveling on data bus $130_{-7}$-$130_0$ and write clock signal 150 based on the write timing window determined in step 520. As described above, with respect to step 520, the write timing window refers to a time period in which data signals on data bus $130_7$-$130_0$, write clock signal 150, or both the data signals on data bus $130_7$-$130_0$ and write clock signal 150 can be phase-adjusted in relation to one another such that memory device 420 properly recovers the data signals on data bus $130_7$-$130_0$.

In reference to FIG. 4, based on the write timing window for the first data pattern, controller 450 can adjust the phase delay in the transmission of data signals on data bus $130_7$-$130_0$ and write clock signal 150 via phase delay circuits 430 and 440, respectively, according to an embodiment of the present invention. In an embodiment, the transmission of data signals on data bus $130_7$-$130_0$ can be adjusted, the transmission of write clock signal 150 can be adjusted, or the transmission of both the data signals on data bus $130_7$-$130_0$ and write clock signal 150 can be adjusted such that the relative phase difference between the data signals on data bus $130_7$-$130_0$ and write clock signal 150 is within the write timing window.

After the relative phase difference between the data signals on data bus $130_7$-$130_0$ and write clock signal 150 has been adjusted based on step 530, processing unit 410 performs write operations on memory device 420 based on the relative phase difference setting, according to an embodiment of the present invention. In an embodiment, the steps of method 500 to adjust the write timing of memory device 420 can be performed on a periodic basis or on an "as-needed" basis as required by computer system 400.

Figure 18:
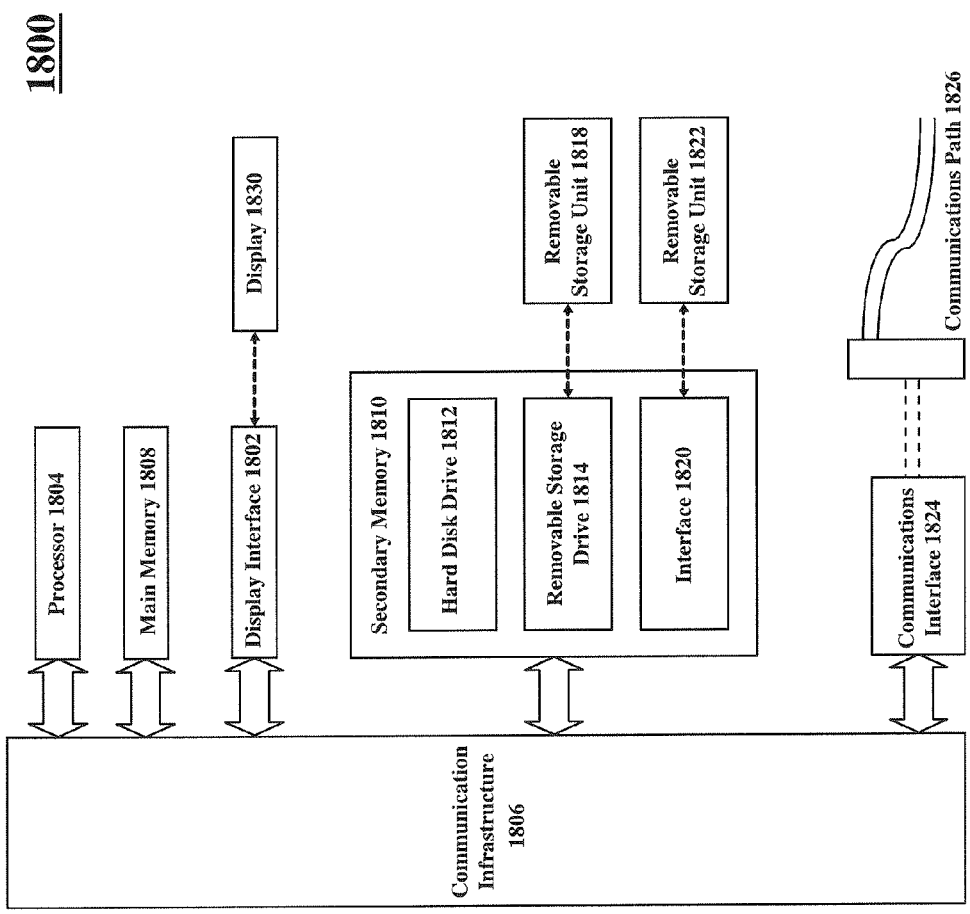
FIG. 18 is an illustration of an example computer system in which embodiments of the present invention can be implemented.

Various aspects of the present invention may be implemented in software, firmware, hardware, or a combination thereof. FIG. 18 is an illustration of an example computer system 1800 in which embodiments of the present invention, or portions thereof, can be implemented as computer-readable code. For example, the method illustrated by flowchart 500 of FIG. 5 can be implemented in computer system 1800. Various embodiments of the present invention are described in terms of this example computer system 1800. After reading this description, it will become apparent to a person skilled in the relevant art how to implement embodiments of the present invention using other computer systems and/or computer architectures.

It should be noted that the simulation, synthesis and/or manufacture of various embodiments of this invention may be accomplished, in part, through the use of computer readable code, including general programming languages (such as C or C++), hardware description languages (HDL) such as, for example, Verilog HDL, VHDL, Altera HDL (AHDL), or other available programming and/or schematic capture tools (such as circuit capture tools). This computer readable code can be disposed in any known computer-usable medium including a semiconductor, magnetic disk, optical disk (such as CD-ROM, DVD-ROM). As such, the code can be transmitted over communication networks including the Internet. It is understood that the functions accomplished and/or structure provided by the systems and techniques described above can be represented in a core (such as a GPU core) that is embodied in program code and can be transformed to hardware as part of the production of integrated circuits.

Computer system 1800 includes one or more processors, such as processor 1804. Processor 1804 may be a special purpose or a general purpose processor (e.g., a GPU). Processor 1804 is connected to a communication infrastructure 1806 (e.g., a bus or network).

Computer system 1800 also includes a main memory 1808, preferably random access memory (RAM), and may also include a secondary memory 1810. Secondary memory 1810 can include, for example, a hard disk drive 1812, a removable storage drive 1814, and/or a memory stick. Removable storage drive 1814 can include a floppy disk drive, a magnetic tape drive, an optical disk drive, a flash memory, or the like. The removable storage drive 1814 reads from and/or writes to a removable storage unit 1818 in a well known manner. Removable storage unit 1818 can comprise a floppy disk, magnetic tape, optical disk, etc. which is read by and written to by removable storage drive 1814. As will be appreciated by persons skilled in the relevant art, removable storage unit 1818 includes a computer-usable storage medium having stored therein computer software and/or data.

In alternative implementations, secondary memory 1810 can include other similar devices for allowing computer programs or other instructions to be loaded into computer system 1800. Such devices can include, for example, a removable storage unit 1822 and an interface 1820. Examples of such devices can include a program cartridge and cartridge interface (such as those found in video game devices), a removable memory chip (e.g., EPROM or PROM) and associated socket, and other removable storage units 1822 and interfaces 1820 which allow software and data to be transferred from the removable storage unit 1822 to computer system 1800.

Computer system 1800 can also include a communications interface 1824. Communications interface 1824 allows software and data to be transferred between computer system 1800 and external devices. Communications interface 1824 can include a modem, a network interface (such as an Ethernet card), a communications port, a PCMCIA slot and card, or the like. Software and data transferred via communications interface 1824 are in the form of signals, which may be electronic, electromagnetic, optical, or other signals capable of being received by communications interface 1824. These signals are provided to communications interface 1824 via a communications path 1826. Communications path 1826 carries signals and can be implemented using wire or cable, fiber optics, a phone line, a cellular phone link, a RF link or other communications channels.

In this document, the terms "computer program medium" and "computer-usable medium" are used to generally refer to media such as removable storage unit 1818, removable storage unit 1822, and a hard disk installed in hard disk drive 1812. Computer program medium and computer-usable medium can also refer to memories, such as main memory 1808 and secondary memory 1810, which can be memory semiconductors (e.g., DRAMs, etc.). These computer program products provide software to computer system 1800.

Computer programs (also called computer control logic) are stored in main memory 1808 and/or secondary memory 1810. Computer programs may also be received via communications interface 1824. Such computer programs, when executed, enable computer system 1800 to implement embodiments of the present invention as discussed herein. In particular, the computer programs, when executed, enable processor 1804 to implement processes of embodiments of the present invention, such as the steps in the methods illustrated by flowchart 500 of FIG. 5, discussed above. Accordingly, such computer programs represent controllers of the computer system 1800. Where embodiments of the present invention are implemented using software, the software can be stored in a computer program product and loaded into computer system 1800 using removable storage drive 1814, interface 1820, hard drive 1812, or communications interface 1824.

Embodiments of the present invention are also directed to computer program products including software stored on any computer-usable medium. Such software, when executed in one or more data processing device, causes a data processing device(s) to operate as described herein. Embodiments of the present invention employ any computer-usable or -readable medium, known now or in the future. Examples of computer-usable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage devices, etc.), and communication mediums (e.g., wired and wireless communications networks, local area networks, wide area networks, intranets, etc.).

While various embodiments of the present invention have been described above, it should be understood that they have been presented by way of example only, and not limitation. It will be understood by persons skilled in the relevant art that various changes in form and details can be made therein without departing from the spirit and scope of the invention as defined in the appended claims. It should be understood that the invention is not limited to these examples. The invention is applicable to any elements operating as described herein. Accordingly, the breadth and scope of the present invention should not be limited by any of the above-described exemplary embodiments, but should be defined only in accordance with the following claims and their equivalents.

What is claimed is:

1. A method for adjusting write timing in a memory device, comprising:
    calculating a write timing window between a signal on a data bus and a write clock signal based on transmission of a training signal to the memory device during a training mode of operation, wherein the memory device has limited accessibility during the training mode of operation; and
    adjusting a phase difference between the signal on the data bus and the write clock signal based on the write timing window, wherein the memory device recovers the signal on the data bus based on the adjusted phase difference.

2. The method of claim 1, further comprising:
    configuring the memory device in the training mode of operation.

3. The method of claim 2, wherein configuring the memory device in the training mode of operation comprises configuring the memory device in at least one of an idle, refresh, and powerdown mode of operation.

4. The method of claim 1, wherein the training signal comprises a first data pattern and wherein determining the write timing window comprises:
    transmitting the first data pattern on a data bus to the memory device, wherein the memory device is configured to store the first data pattern based on the write clock signal;
    receiving a second data pattern from the memory device, wherein the second data pattern comprises the first data pattern stored in the memory device;
    comparing the first data pattern to the second data pattern to determine whether the first and second data patterns match each other; and
    determining a first timing boundary and a second timing boundary of the write timing window based on the comparison of the first and second data patterns.

5. The method of claim 4, wherein if the first and second data patterns match each other, determining the first timing boundary and the second timing boundary of the timing window comprises:
    iteratively repeating a sequence of the transmitting, receiving, and comparing steps for positive incremental phase shifts in the first data pattern to determine the first timing boundary, wherein the first timing boundary is defined by the last positive incremental phase shift in the first data pattern in which the positive phase-shifted first data pattern matches the corresponding second data pattern; and
    iteratively repeating the sequence of the transmitting, receiving, and comparing steps for negative incremental phase shifts in the first data pattern to determine the second timing boundary, wherein the second timing boundary is defined by the last negative incremental phase shift in the first data pattern in which the negative phase-shifted first data pattern matches the corresponding second data pattern.

6. The method of claim 4, wherein if the first and second data patterns match each other, determining the first timing boundary and the second timing boundary of the timing window comprises:
iteratively repeating a sequence of the transmitting, receiving, and comparing steps for positive incremental phase shifts in the write clock signal to determine the first timing boundary, wherein the first timing boundary is defined by the last positive incremental phase shift in the write clock signal in which the first data pattern matches the corresponding second data pattern; and
iteratively repeating the sequence of the transmitting, receiving, and comparing steps for negative incremental phase shifts in the write clock signal to determine the second timing boundary, wherein the second timing boundary is defined by the last negative incremental phase shift in the write clock signal in which the first data pattern matches the corresponding second data pattern.

7. The method of claim 4, wherein if the first and second data patterns do not match each other, determining the first timing boundary and the second timing boundary of the timing window comprises:
iteratively repeating a sequence of the transmitting, receiving, and comparing steps for positive incremental phase shifts in the first data pattern to determine the first timing boundary, wherein the first timing boundary is defined by the first positive incremental phase shift in the first data pattern in which the positive phase-shifted first data pattern matches the corresponding second data pattern; and
starting at the first timing boundary, iteratively repeating the sequence of the transmitting, receiving, and comparing steps for positive incremental phase shifts in the first data pattern to determine the second timing boundary, wherein the second timing boundary is defined by the last positive incremental phase shift in the first data pattern in which the positive phase-shifted first data pattern matches the corresponding second data pattern.

8. The method of claim 4, wherein if the first and second data patterns do not match each other, determining the first timing boundary and the second timing boundary of the timing window comprises:
iteratively repeating a sequence of the transmitting, receiving, and comparing steps for positive incremental phase shifts in the write clock signal to determine the first timing boundary, wherein the first timing boundary is defined by the first positive incremental phase shift in the write clock signal in which the first data pattern matches the corresponding second data pattern; and
starting at the first timing boundary, iteratively repeating the sequence of the transmitting, receiving, and comparing steps for positive incremental phase shifts in the write clock signal to determine the second timing boundary, wherein the second timing boundary is defined by the last positive incremental phase shift in the write clock signal in which the first data pattern matches the corresponding second data pattern.

9. The method of claim 4, wherein receiving the second data pattern comprises receiving the second data pattern at an interface of a processing unit.

10. The method of claim 4, wherein comparing the first data pattern to the second data pattern comprises comparing each bit in the first data pattern to each corresponding bit in the second data pattern to determine whether the first and second data patterns match each other.

11. The method of claim 1, wherein adjusting the phase difference comprises introducing a phase delay in at least one of the signal on the data bus, the write clock signal, and both the signal on the data bus and the write clock signal.

12. The method of claim 1, wherein the limited accessibility of the memory device comprises a read mode of operation not being able to use a resource of the memory device.

13. The method of claim 1, wherein the limited accessibility of the memory device comprises a write mode of operation not being able to use a resource of the memory device.

14. A method for adjusting write timing in a memory device, comprising:
receiving a training signal during a training mode of operation, wherein the memory device has limited accessibility during the training mode of operation, and wherein the training signal comprises a first data pattern transmitted from a processing unit;
storing the training signal, wherein the stored training signal comprises a second data pattern;
transmitting the second data pattern to the processing unit; and
receiving a signal on a data bus, wherein a phase difference between the signal on the data bus and a write clock signal is within a write timing window, the write timing window based on a comparison between the first data pattern and the second data pattern.

15. The method of claim 14, further comprising:
operating in the training mode of operation.

16. The method of claim 14, wherein operating in the training mode of operation comprises operating in at least one of an idle, refresh, and powerdown mode of operation.

17. The method of claim 14, wherein receiving the training signal comprises sampling the first data pattern at an interface of the memory device based on the write clock signal.

18. The method of claim 14, wherein storing the training signal comprises storing the second data pattern, the second data pattern having different bit information from the first data pattern.

19. The method of claim 14, wherein receiving the signal on the data bus comprises receiving the signal on the data bus that is between a first boundary and a second boundary of the write timing window.

20. A system comprising:
a memory device; and
a processing unit coupled to the memory device and configured to:
determine a write timing window between a signal on a data bus and a write clock signal based on a training signal during a training mode of operation, wherein the memory device has limited accessibility during the training mode of operation; and
adjust a phase difference between the signal on the data bus and the write clock signal based on the write timing window, wherein the memory device recovers the signal on the data bus based on the adjusted phase difference.

21. The system of claim 20, wherein the processing unit is configured to place the memory device in the training mode of operation during at least one of an idle, a refresh, and powerdown mode of operation.

22. The system of claim 20, wherein the training signal comprises a first data pattern and the processing unit is configured to:

transmit the first data pattern on a data bus to the memory device, wherein the memory device is configured to store the first data pattern based on the write clock signal;

receive a second data pattern from the memory device, wherein the second data pattern comprises the first data pattern stored in the memory device;

compare the first data pattern to the second data pattern to determine whether the first and second data patterns match each other; and determine a first timing boundary and a second timing boundary of the write timing window based on the comparison of the first and second data patterns.

23. The system of claim 22, wherein if the first and second data patterns match each other, the processing unit is configured to determine the first timing boundary and the second timing boundary of the timing window based on:

iteratively repeating a sequence of the transmit, receive and compare functions for positive incremental phase shifts in the first data pattern to determine the first timing boundary, wherein the first timing boundary is defined by the last positive incremental phase shift in the first data pattern in which the positive phase-shifted first data pattern matches the corresponding second data pattern; and iteratively repeating the sequence of the transmit, receive, and compare functions for negative incremental phase shifts in the first data pattern to determine the second timing boundary, wherein the second timing boundary is defined by the last negative incremental phase shift in the first data pattern in which the negative phase-shifted first data pattern matches the corresponding second data pattern.

24. The system of claim 22, wherein if the first and second data patterns match each other, the processing unit is configured to determine the first timing boundary and the second timing boundary of the timing window based on:

iteratively repeating a sequence of the transmit, receive, and compare functions for positive incremental phase shifts in the write clock signal to determine the first timing boundary, wherein the first timing boundary is defined by the last positive incremental phase shift in the write clock signal in which the first data pattern matches the corresponding second data pattern; and iteratively repeating the sequence of the transmit, receive, and compare functions for negative incremental phase shifts in the write clock signal to determine the second timing boundary, wherein the second timing boundary is defined by the last negative incremental phase shift in the write clock signal in which the first data pattern matches the corresponding second data pattern.

25. The system of claim 22, wherein if the first and second data patterns do not match each other, the processing unit is configured to determine the first timing boundary and the second timing boundary of the timing window based on:

iteratively repeating a sequence of the transmit, receive, and compare functions for positive incremental phase shifts in the first data pattern to determine the first timing boundary, wherein the first timing boundary is defined by the first positive incremental phase shift in the first data pattern in which the positive phase-shifted first data pattern matches the corresponding second data pattern; and starting at the first timing boundary, iteratively repeating the sequence of the transmit, receive, and compare functions for positive incremental phase shifts in the first data pattern to determine the second timing boundary, wherein the second timing boundary is defined by the last positive incremental phase shift in the first data pattern in which the positive phase-shifted first data pattern matches the corresponding second data pattern.

26. The system of claim 22, wherein if the first and second data patterns do not match each other, the processing unit is configured to determine the first timing boundary and the second timing boundary of the timing window based on:

iteratively repeating a sequence of the transmit, receive, and compare functions for positive incremental phase shifts in the write clock signal to determine the first timing boundary, wherein the first timing boundary is defined by the first positive incremental phase shift in the write clock signal in which the first data pattern matches the corresponding second data pattern; and starting at the first timing boundary, iteratively repeating the sequence of the transmit, receive, and compare functions for positive incremental phase shifts in the write clock signal to determine the second timing boundary, wherein the second timing boundary is defined by the last positive incremental phase shift in the write clock signal in which the first data pattern matches the corresponding second data pattern.

27. The system of claim 20, wherein the processing unit is configured to introduce a phase delay in at least one of the signal on the data bus, the write clock signal, and both the signal on the data bus and the write clock signal when adjusting the phase difference between the signal on the data bus and the write clock signal.

28. A system comprising:

a processing unit; and a memory device coupled to the processing unit and configured to:

receive a training signal during a training mode of operation, wherein the memory, device has limited accessibility during the training mode of operation, and wherein the training signal comprises a first data pattern transmitted from a processing unit;

store the training signal, wherein the stored training signal comprises a second data pattern;

transmit the second data pattern to the processing unit; and receive a signal on a data bus, wherein a phase difference between the signal on the data bus and a write clock signal is within a write timing window, the write timing window based on a comparison between the first data pattern and the second data pattern.

29. The system of claim 28, wherein the memory device is configured to operate in at least one of an idle, refresh, and powerdown mode of operation.

30. The system of claim 28, wherein the memory device is configured to sample the first data pattern at an interface of the memory device based on the write clock signal when receiving the training signal.

31. The system of claim 28, wherein the memory device is configured to store the second data pattern, the second data pattern having different bit information from the first data pattern.

32. The system of claim 28, wherein the memory device is configured to receive the signal on the data bus that is between a first boundary and a second boundary of the write timing window.

33. A computer program product comprising a computer-usable medium having computer program logic recorded thereon enabling a processor to analyze software code, the computer program logic comprising:

first computer readable program code that enables a processor to configure the memory device in a training mode of operation, wherein the memory device has limited accessibility during the training mode of operation;

second computer readable program code that enables a processor to determine a write timing window between a signal on a data bus and a write clock signal based on a training signal; and third computer readable program code that enables a processor to adjust a phase difference between the signal on the data bus and the write clock signal based on the write timing window, wherein the memory device recovers the signal on the data bus based on the adjusted phase difference.

34. The computer program product of claim 33, wherein the training signal comprises a first data pattern and wherein the second computer readable program code comprises:

fourth computer readable program code that enables a processor to transmit the first data pattern on a data bus to the memory device, wherein the memory device is configured to store the first data pattern based on the write clock signal;

fifth computer readable program code that enables a processor to receive a second data pattern from the memory device, wherein the second data pattern comprises the first data pattern stored in the memory device;

sixth computer readable program code that enables a processor to compare the first data pattern to the second data pattern to determine whether the first and second data patterns match each other; and seventh computer readable program code to enable a processor to determine a first timing boundary and a second timing boundary of the write timing window based on the comparison of the first and second data patterns.

35. The computer program product of claim 34, wherein if the first and second data patterns match each other, the seventh computer readable program code comprises:

eighth computer readable program code to enable a processor to iteratively repeat a sequence of the fourth, fifth, and sixth computer readable program codes for positive incremental phase shifts in the first data pattern to determine the first timing boundary, wherein the first timing boundary is defined by the last positive incremental phase shift in the first data pattern in which the positive phase-shifted first data pattern matches the corresponding second data pattern; and ninth computer readable program code to enable a processor to iteratively repeat the sequence of the fourth, fifth, and sixth computer readable program codes for negative incremental phase shifts in the first data pattern to determine the second timing boundary, wherein the second timing boundary is defined by the last negative incremental phase shift in the first data pattern in which the negative phase-shifted first data pattern matches the corresponding second data pattern.

36. The computer program product of claim 34, wherein if the first and second data patterns match each other, the seventh computer readable program code comprises:

eighth computer readable program code to enable a processor to iteratively repeat a sequence of the fourth, fifth, and sixth computer readable program codes for positive incremental phase shifts in the write clock signal to determine the first timing boundary, wherein the first timing boundary is defined by the last positive incremental phase shift in the write clock signal in which the first data pattern matches the corresponding second data pattern; and ninth computer readable program code to enable a processor to iteratively repeat the sequence of the fourth, fifth, and sixth computer readable program codes for negative incremental phase shifts in the first data pattern to determine the second timing boundary, wherein the second timing boundary is defined by the last negative incremental phase shift in the write clock signal in which the first data pattern matches the corresponding second data pattern.

37. The computer program product of claim 34, wherein if the first and second data patterns do not match each other, the seventh computer readable program code comprises:

eighth computer readable program code to enable a processor to iteratively repeat a sequence of the fourth, fifth, and sixth computer readable program codes for positive incremental phase shifts in the first data pattern to determine the first timing boundary, wherein the first timing boundary is defined by the first positive incremental phase shift in the first data pattern in which the positive phase-shifted first data pattern matches the corresponding second data pattern; and ninth computer readable program code to enable a processor to start at the first timing boundary and to iteratively repeat the sequence of the fourth, fifth, and sixth computer readable program codes for positive incremental phase shifts in the first data pattern to determine the second timing boundary, wherein the second timing boundary is defined by the last positive incremental phase shift in the first data pattern in which the negative phase-shifted first data pattern matches the corresponding second data pattern.

38. The computer program product of claim 34, wherein if the first and second data patterns do not match each other, the seventh computer readable program code comprises:

eighth computer readable program code to enable a processor to iteratively repeat a sequence of the fourth, fifth, and sixth computer readable program codes for positive incremental phase shifts in the write clock signal to determine the first timing boundary, wherein the first timing boundary is defined by the first positive incremental phase shift in the write clock signal in which the first data pattern matches the corresponding second data pattern; and ninth computer readable program code to enable a processor to start at the first timing boundary and to iteratively repeat the sequence of the fourth, fifth, and sixth computer readable program codes for positive incremental phase shifts in the first data pattern to determine the second timing boundary, wherein the second timing boundary is defined by the last positive incremental phase shift in the write clock signal in which the first data pattern matches the corresponding second data pattern.

39. A method for adjusting write timing in a memory device, comprising:

calculating a write timing window between a signal on a data bus and a write clock signal based on transmission of a training signal to the memory device during a training mode of operation, wherein the training signal comprises a first data pattern and wherein determining the write timing window comprises:

transmitting the first data pattern on a data bus to the memory device, wherein the memory device is configured to store the first data pattern based on the write clock signal, receiving a second data pattern from the memory device, wherein the second data pattern comprises the first data pattern stored in the memory device, comparing the first data pattern to the second data pattern to determine whether the first and second data patterns match each other, and determining a first timing boundary and a second timing boundary of the write timing window based on the comparison of the first and second data patterns; and adjusting a phase difference between the signal on the data bus and the write clock signal based on the write timing window, wherein the memory device recovers the signal on the data bus based on the adjusted phase difference.

* * * * *